US012676372B2

(12) United States Patent

Evans

(10) Patent No.: US 12,676,372 B2

(45) Date of Patent: Jul. 7, 2026

(54) MODULAR BATTERY CABINET TRAY

(71) Applicant: Moment Energy Inc., Port Coquitlam (CA)

(72) Inventor: James Daniel Evans, Vancouver (CA)

(73) Assignee: Moment Energy Inc., Coquitlam (CA)

( * ) Notice: Subject to any disclaimer, the term of this patent is extended or adjusted under 35 U.S.C. 154(b) by 804 days.

(21) Appl. No.: 17/990,297

(22) Filed: Nov. 18, 2022

(65) Prior Publication Data

US 2024/0170778 A1 May 23, 2024

(51) Int. Cl.

| | |
|---|---|
| *H01M 50/20* | (2021.01) |
| *H01M 10/613* | (2014.01) |
| *H01M 10/6556* | (2014.01) |
| *H01M 50/204* | (2021.01) |
| *H01M 50/264* | (2021.01) |
| *H01M 50/267* | (2021.01) |
| *H05K 7/20* | (2006.01) |

(52) U.S. Cl.

CPC ....... *H01M 50/204* (2021.01); *H01M 10/613* (2015.04); *H01M 10/6556* (2015.04); *H01M 50/264* (2021.01); *H01M 50/267* (2021.01); *H05K 7/20218* (2013.01)

(58) Field of Classification Search

None

See application file for complete search history.

(56) References Cited

U.S. PATENT DOCUMENTS

| | | | |
|---|---|---|---|
| 7,479,346 B1 | 1/2009 | Chow et al. | |
| 7,602,145 B2 | 10/2009 | Renda | |

| | | | |
|---|---|---|---|
| 7,723,955 B2 | 5/2010 | Zaag et al. | |
| 7,740,142 B2 | 6/2010 | Miller et al. | |
| 8,686,693 B2 | 4/2014 | Bhowmik et al. | |
| 8,963,499 B2 | 2/2015 | Choi | |
| 9,077,181 B2 | 7/2015 | Schlaupitz et al. | |
| 9,112,205 B2 | 8/2015 | Conrardy et al. | |
| 9,148,029 B2 | 9/2015 | Tsa | |
| 9,172,259 B2 | 10/2015 | Hwang | |
| 9,236,749 B2 | 1/2016 | Gibbs et al. | |
| 9,277,298 B2 | 3/2016 | Yang et al. | |
| 9,300,016 B2 | 3/2016 | Yun | |
| 9,331,497 B2 | 5/2016 | Beaston | |

(Continued)

FOREIGN PATENT DOCUMENTS

| | | | | | |
|---|---|---|---|---|---|
| CN | 216624428 U | * | 5/2022 | | |
| CN | 217426867 U | | 9/2022 | | |
| RU | 201981 U1 | * | 1/2021 | ............... | H02B 1/32 |

OTHER PUBLICATIONS

Machine translation of RU 201981 U1 (Year: 2025).*

(Continued)

*Primary Examiner* — Maria Laios

(74) *Attorney, Agent, or Firm* — Foley & Lardner LLP

(57) ABSTRACT

A battery energy storage system can include an enclosure including a panel to provide access to a cavity defined by the enclosure. The battery energy storage system a frame positioned within the cavity. The frame can include a first rail to accommodate a first battery tray coupled with a first battery of a first battery type and a second rail to accommodate a second battery tray coupled with a second battery of a second battery type. A dimension of the first battery type is different than a dimension of the second battery type.

20 Claims, 11 Drawing Sheets

(56)  References Cited

U.S. PATENT DOCUMENTS

| | | | |
|---|---|---|---|
| 9,455,580 | B2 | 9/2016 | Mao et al. |
| 9,488,977 | B2 | 11/2016 | Cho et al. |
| 9,641,013 | B2 | 5/2017 | Lee et al. |
| 9,705,340 | B2 | 7/2017 | Lucea |
| 9,755,200 | B2 | 9/2017 | Conrardy et al. |
| 9,847,654 | B2 | 12/2017 | Beaston |
| 10,153,624 | B2 | 12/2018 | Park et al. |
| 10,181,733 | B2 | 1/2019 | Jo |
| 10,193,112 | B2 | 1/2019 | Zimbru et al. |
| 10,283,974 | B2 | 5/2019 | Macris |
| 10,439,372 | B2 | 10/2019 | Chen et al. |
| 10,894,498 | B2 | 1/2021 | Lee et al. |
| 11,108,111 | B2 * | 8/2021 | Lindstrom ........ H01M 10/6551 |
| 11,383,617 | B2 | 7/2022 | Woeste et al. |
| 11,522,245 | B2 | 12/2022 | Lee et al. |
| 11,699,909 | B1 | 7/2023 | Kahn et al. |
| 11,831,192 | B2 | 11/2023 | Kahn et al. |
| 2019/0097280 | A1 | 3/2019 | You et al. |
| 2022/0285779 | A1 | 9/2022 | Kim et al. |
| 2022/0294051 | A1 | 9/2022 | Kim et al. |
| 2022/0311255 | A1 | 9/2022 | Lim |
| 2023/0040296 | A1 | 2/2023 | Jeong et al. |
| 2023/0050428 | A1 | 2/2023 | Lee et al. |
| 2023/0148088 | A1 | 5/2023 | Lee et al. |
| 2023/0253803 | A1 | 8/2023 | Kahn et al. |
| 2024/0088700 | A1 | 3/2024 | Kahn et al. |

OTHER PUBLICATIONS

Machine translation of CN216624428U (Year: 2025).*
Foreign Action other than Search Report on CA 3219813 Dated Apr. 29, 2025.

* cited by examiner

1100

Provide frame — 1105

MODULAR BATTERY CABINET TRAY

BACKGROUND

Electric power can be provided to buildings, equipment, or other devices. Batteries can store electric power.

SUMMARY

Battery energy storage systems can include at least one rechargeable battery to provide power to a device or system (e.g., a building, medical equipment, manufacturing equipment, or other system) or to receive or store power from a device or system (e.g., a solar panel, a windmill, or other energy harvesting device). The battery energy storage system can include at least one first tray positioned within an interior cavity of an enclosure. The first tray can be slidably coupled with a frame of the cabinet. The first tray can include a first member and a second member, the first and second members having first dimensions to support a first battery of a first battery type within the enclosure. The battery energy storage system can include at least one second tray positioned within the cavity of the enclosure. The second tray can be slidably coupled with the frame of the cabinet. The second tray can include a first member and a second member, the first and second members having second dimensions to support a second battery of a second battery type within the enclosure. The first dimensions can differ from the second dimensions. Both the first tray and the second tray can interact with (e.g., be supported by, contact, roll along) the frame.

At least one aspect is directed to a system. The system can be a battery energy storage system. The battery energy storage system can include an enclosure including a panel to provide access to a cavity defined by the enclosure. The battery energy storage system can include a frame positioned within the cavity. The frame can include a first rail to accommodate a first battery tray coupled with a first battery of a first battery type and a second rail to accommodate a second battery tray coupled with a second battery of a second battery type. A dimension of the first battery type is different than a dimension of the second battery type.

At least one aspect is directed to an apparatus. The apparatus can be a frame for a battery energy storage system. The frame can include a first pair of rails coupled with the frame and separated by a distance, the first pair of rails to support a first battery tray, the first battery tray to accommodate a first battery type. The frame can include a second pair of rails coupled with the frame and separated by the distance, the second pair of rails to support a second battery tray, the second battery tray to accommodate a second battery type. A first battery of the first battery type can include a dimension that differs from a dimension of a second battery of the second battery type.

At least one aspect is directed to a method. The method can include coupling a first battery tray with a first battery of a first battery type. The method can include coupling a second battery tray with a second battery of a second battery type. The method can further include moving the first battery tray and the first battery along a first pair of rails of a battery energy storage system frame, the first pair of rails separated by a distance. The method can further include moving the second battery tray and the second battery along a second pair of rails of the battery energy storage system frame, the second pair of rails separated by the distance. A dimension of first battery of the first battery type can differ from a dimension of the second battery of the second battery type.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification. The foregoing information and the following detailed description and drawings include illustrative examples and should not be considered as limiting.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing. In the drawings.

DETAILED DESCRIPTION

Following below are more detailed descriptions of various concepts related to, and implementations of, methods, apparatuses, and systems of energy storage. The various concepts introduced above and discussed in greater detail below may be implemented in any of numerous ways.

The present disclosure is directed to energy storage systems, such as battery energy storage systems and related apparatuses and methods. Battery energy storage systems can include a cabinet defining an interior to house at least one battery. The battery can be rechargeable a battery, such as a battery having a lithium-based chemistry, a nickel-based chemistry, or other chemistry. The battery can include a battery from an electric vehicle. For example, the battery can include a second-life electric vehicle battery that has been removed from an electric vehicle after its useful life in said electric vehicle. The battery energy storage system can include at least one tray positioned within the cavity of the enclosure. The tray can be slidably coupled with the enclosure. The battery can be coupled with the tray such that the battery is slidably coupled with the enclosure. The battery energy storage system can house a battery to store electrical energy from a power source (e.g., an energy-generating device such as a windmill) and to provide electrical energy to another device or system (e.g., a building, a car, medical equipment, or other device or system).

The disclosed solutions have a technical advantage of having a modular tray design to allow use of multiple batteries of varying battery types to be used in the battery energy storage system. For example, the battery energy storage system can include a first tray to support or couple with a first battery, where the first battery is of a first battery type. The first tray can include first dimensions associated with the first battery type to accommodate the first battery. The first battery can be from a first electric vehicle, for example. The battery energy storage system can include a second tray to support or couple with a second battery, where the second battery is of a second battery type. The second tray can include second dimensions associated with the second battery type to accommodate the second battery. The second battery can be from a second electric vehicle, for example. Each of the first tray and the second tray can be slidably coupled with a frame of the enclosure. For example, each tray can include at least one dimension (e.g., a width) that corresponds with a dimension of the frame such that both the first tray and the second tray can interact with (e.g., be coupled with, roll along, be supported by) the frame, regardless of a difference between the first dimensions or the second dimensions of the first tray and second tray, respectively.

Figure 1:
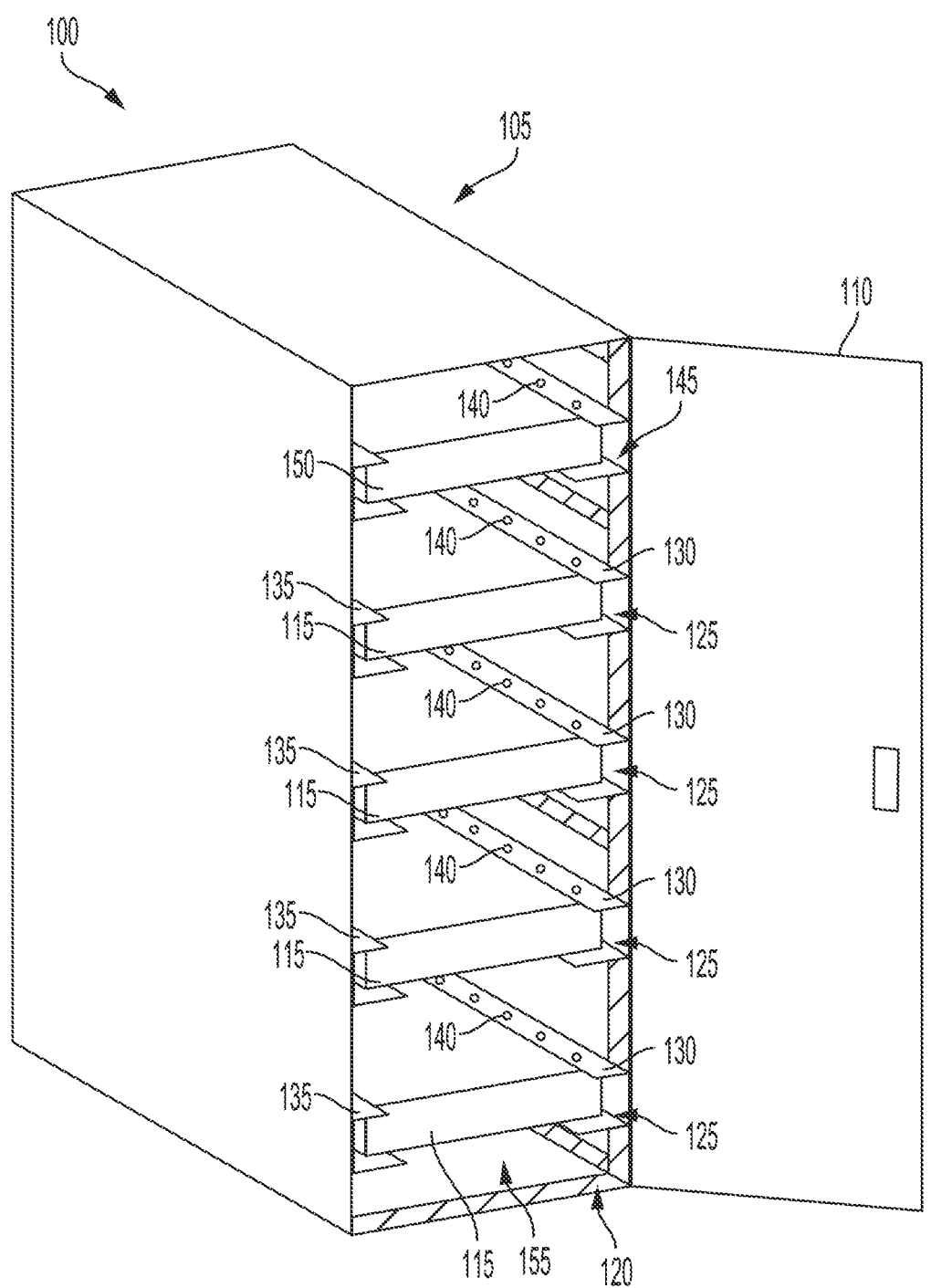
FIG. 1 depicts an example battery energy storage system, in accordance with some aspects.
Figure 2:
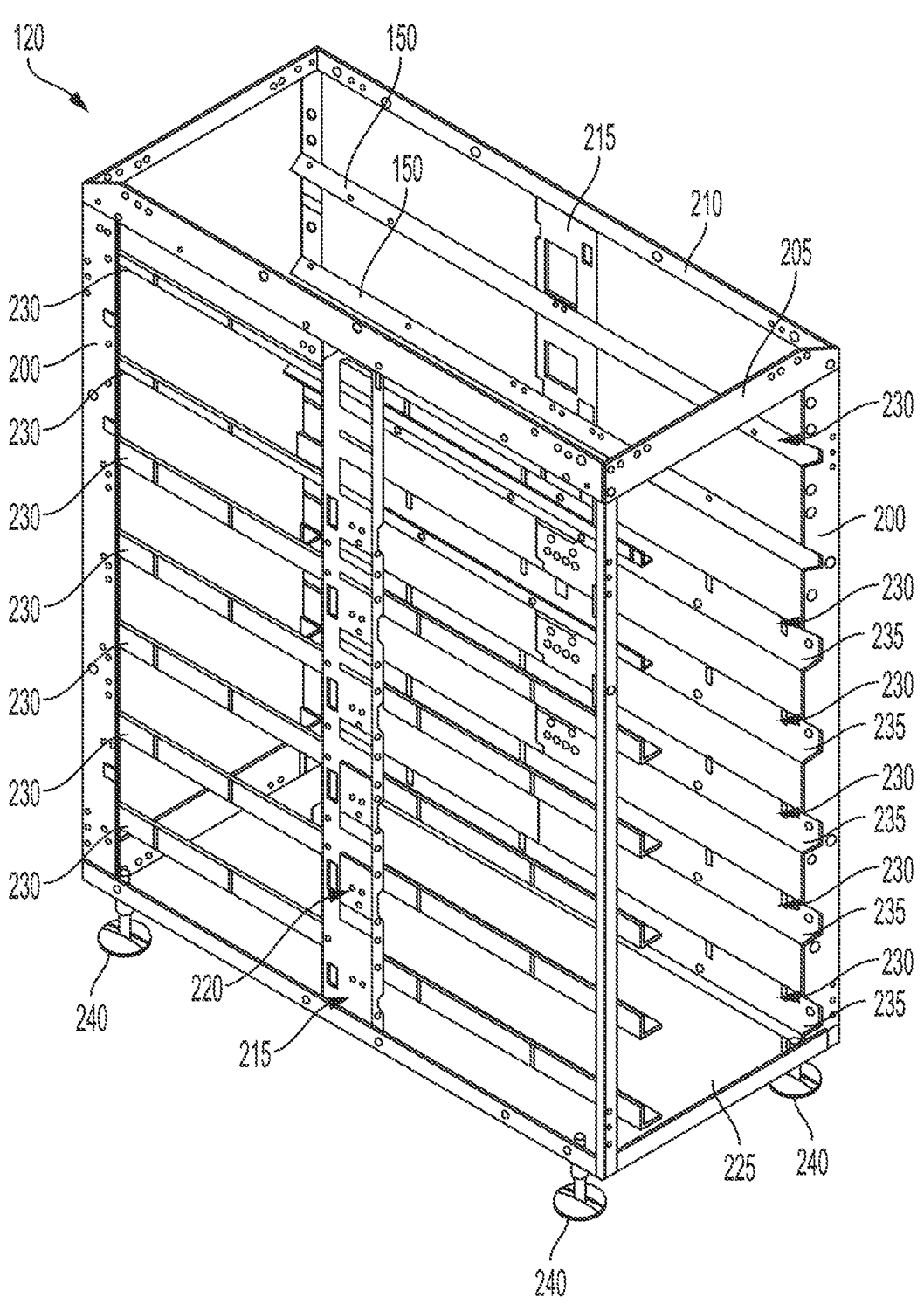
FIG. 2 depicts an example frame for a battery energy storage system, in accordance with some aspects.

FIGS. 1 and 2, among others, depict a battery energy storage system 100. For example, the battery energy storage system 100 can include an enclosure 105, a frame 120, at least one battery tray 125, at least one auxiliary tray 145, and at least one battery 115. The enclosure 105 can define a cavity 155. For example, the enclosure 105 can include a plurality of walls that define and enclose the cavity 155. The enclosure 105 can include a panel 110 that is moveable (e.g., rotatable, pivotable, slidable, removable) to provide access to the cavity 155. For example, the panel 110 can be hingedly coupled with the enclosure 105 to provide selective access to the cavity 155 with the panel 110 in an open position. The enclosure 105 can include a parallelepiped form factor, a pentagonal form factor, a prismatic form factor, a cylindrical form factor, or some other form factor. For example, the enclosure 105 can include a parallelepiped form factor with the cavity also including a parallelepiped form factor, as is depicted in FIG. 1, among others.

The enclosure 105 can include a metal (e.g., steel, aluminum, or other metal) material composition, a composite material composition, a polymeric material composition, or some other material composition. The enclosure 105 can be or include a corrosion-resistant material or coating. For example, the enclosure 105 can be heat-treated, painted, powder coated, or otherwise coated with a corrosion-resistant material such that the enclosure 105 can resist weather elements (e.g., rain, snow, extreme temperatures, or other elements). The enclosure 105 can include casters, wheels, rollers, tracks, or some other mechanism to facilitate a movement of the enclosure 105. For example, the enclosure 105 can include a plurality of wheels mounted on a bottom of the enclosure 105 to facilitate the movement of the enclosure 105 along a ground surface such that the battery energy storage system 100 can be portable or semi-portable.

The frame 120 of the battery energy storage system 100 can be positioned within the cavity 155 defined by the enclosure 105. For example, the frame 120 can include a plurality of frame members to define a form factor of the enclosure 105. The enclosure 105 can include at least one panel (e.g., a top panel, a side panel, a bottom panel) that is coupled with the frame 120 to form the enclosure 105. For example, the frame 120 can be a frame around which the enclosure 105 is formed or to which one or more panels of the enclosure 105 are coupled. The frame 120 can include a parallelepiped form factor, or a pentagonal form factor, a prismatic form factor, a cylindrical form factor, or some other form factor. For example, the frame 120 can include a form factor that is the same as or substantially similar to (e.g., ±95% similar) to the form factor of the enclosure 105.

As depicted in FIG. 2, among others, the frame 120 can include at least one first member 200, at least one second member 205, at least one third member 210, and a base 225. For example, the first member 200 can be or include a vertical post or slender member oriented in a vertical direction (e.g., extending upwards from a ground surface, extending in a direction having vertical component, extending along a Z-axis). The frame 120 can include four first members 200. For example, if the enclosure 105 or the frame 120 includes a parallelepiped form factor, the frame 120 can include four first members 200 positioned at each of four corners of the frame 120 and oriented in a vertical direction. The second member 205 can include or include a horizontal post or slender member oriented in a first horizontal direction (e.g., extending from a first side to a second side, extending along an X-axis). For example, the frame 120 can include four second members 205 positioned in a horizontal orientation at a top and bottom of both a front side and a rear side of the frame 120 with the frame 120 or the enclosure 105 having a parallelepiped form factor. The third member 210 can be or include a horizontal post or slender member oriented in a second horizontal direction (e.g., extending from the front side to the rear side of the frame 120, extending along a Y-axis). For example, the frame 120 can include four third members 210 positioned in a horizontal orientation at a top and bottom of both the first side and the second side of the frame 120 with the frame 120 or the enclosure 105 having a parallelepiped form factor. The base 225 can be a bottom member of the frame 120, enclosure 105, or battery energy storage system 100. For example, the base 225 can be a plate or other member that extends between two second members 205 and two third members 210 to define a horizontal surface. The base 225 can be coupled with at least one second member 205, at least one third member 210, or at least one first member 200. The base 225 can be part of the enclosure 105, for example.

The frame 120 can include at least one spine member 215. For example, the frame 120 can include a spine member 215 positioned between two first members 200 and extending in a vertical direction (e.g., in a direction having a vertical component, a direction parallel to at least one first member 200). As depicted in FIG. 2, the frame 120 can include two spine members 215, one on a first side of the frame 120 and the other on a second side of the frame 120. The spine member 215 can define a passage 220 extending along at least a portion of the spine member 215. For example, the spine member 215 can define a passage 220 that extends from a first point proximate a top of the frame 120 to a second point proximate a bottom of the frame 120. The spine member 215 can define at least one opening. For example, the spine member 215 can define an opening to allow an object (e.g., an electrical wire, a coolant line, or some other object) to extend from within the passage into the cavity 155 of the enclosure 105. The spine member 215 can define a plurality of openings positioned along the length of the spine member 215, with each opening providing access from the cavity 155 to the passage 220 or from the passage 220 to the cavity 155.

The frame 120 can include the first member 200, the second member 205, the third member 210, and the spine member 215 coupled together. For example, each of the first members 200, second members 205, third members 210, or spine members 215 of the frame 120 can be coupled with at least one other first member 200, second member 205, third member 210, or spine member 215. The first member 200, second member 205, third member 210, and spine member 215 can include at least one fastener (e.g., a screw, bolt, rivet, or other fastener) or aperture to receive a fastener that can correspond to an aperture to receive a fastener or a fastener of another first member 200, second member 205, third member 210, or spine member 215. For example, the first member 200 can include an aperture to receive a fastener of the second member 205 and the third member 210 to form a corner of the frame 120.

The battery energy storage system 100 can include the frame 120 including at least one rail 230. For example, the frame 120 of the battery energy storage system 100 can include a plurality of rails 230 extending parallel to the third member 210 and extending from a front of the frame 120 to a rear of the frame 120. The battery energy storage system 100 can include the rails 230 to support a tray, such as a battery tray 125 or an auxiliary tray 145. For example, the frame 120 can include a plurality of pairs of rails 230 to support a plurality of battery trays 125 and at least one pair of rails 230 to support an auxiliary tray 145. The pairs of rails 230 can be arranged such that a first rail 230 is positioned at or proximate (e.g., within two centimeters of, within five centimeters of) a first side (e.g., a right side) of the frame 120 and a second rail 230 is positioned at or proximate to (e.g., within two centimeters of, within five centimeters of) a second side (e.g., a left side) of the frame 120. The first rail 230 and the second rail 230 can be positioned parallel with each other and within a horizontal plane or a substantially horizontal plane (e.g., ±15° from horizontal). For example, the frame 120 can include a multiple pairs of rails 230 spaced apart along the frame 120, with each pair of rails 230 positioned within a plane that is parallel or substantially parallel (e.g., ±15° from parallel) planes defined by each other pair of rails 230.

The battery energy storage system 100 can include the rail 230 coupled with the first member 200 of the frame 120. For example, the first member 200 can extend in a generally vertical direction, as discussed above. The rail 230 can be coupled with the first member 200 with the rail 230 extending perpendicular or substantially perpendicular (e.g., ±15° from perpendicular) with the first member 200. The rail 230 can be coupled with two or more first members 200. For example, the rail 230 can be coupled with a first first member 200 defining a front of the frame 120. The same rail 230 can also be coupled with a second first member 200 defining a rear of the frame 12. For example, the rail 230 can extend from a front of the frame 120 to a rear of the frame 120 with the rail 230 coupled with two first members 200. The first member 200 can include at least one fastener (e.g., a bolt, screw, rivet, or other fastener) or can define at least one aperture to receive a fastener. For example, the rail 230 can receive the fastener of the first member 200, or a fastener (e.g., bolt, screw, rivet, or other fastener) of the rail 230 can be received by the aperture of the first member 200. The rail 230 can be coupled with a spine member 215. For example, a spine member 215 can be positioned along a side (e.g., a first side, a right side, a second side, a left side) of the frame 120 between two first members 200, as depicted in FIG. 2. The rail 230 can extend perpendicularly or substantially perpendicularly (e.g., ±15° from perpendicular) from the spine member 215. The spine member 215 can include a fastener or can define an aperture to receive a fastener of the rail 230. The rail 230 can be coupled with a second member 205, a third member 210, or some other member.

The rail 230 can include or define a lip, edge, or surface 235. For example, the rail 230 can define a horizontal surface 235 or a substantially horizontal surface (e.g., ±15° from horizontal or ±15° from parallel with the base 225) that extends from the first member 200 or the spine member 215 towards a center of the cavity 155. The rail 230 can define the surface 235 extending from the first member 200 or the spine member 215 inwards towards a center of the enclosure 105. The surface 235 can extend from a front of the frame 120 to a rear of the frame 120. The surface 235 can extend from the first member 200 for a distance (e.g., two or more centimeters, five or more centimeters, ten or more centimeters, or some other distance). The surface 235 can be rigidly coupled with the frame 120 such that the surface 235 can support a weight (e.g., ten kilograms, fifty kilograms, one hundred kilograms, or more than one hundred kilograms). For example, the rail 230 can be or include an angle iron or slender member having an L-shaped cross-sectional shape such that a portion of the cross-sectional shape of the rail 230 extends parallel the first member 200 with the surface 235 extending perpendicular to the first member 200. The battery energy storage system 100 can include the surface 235 of the rail 230 to support a battery 115 or a battery tray 125 coupled with a battery 115. For example, as discussed in detail below, surface 235 of the rail 230 can support a battery tray 125 that is coupled with a battery 115.

The frame 120 can include at least one leveling device 240. For example, as depicted in FIG. 2, among others, the frame 120 can include a multiple leveling devices 240. The leveling device 240 can be positioned underneath the frame 120 (e.g., beneath the base 225) to support the frame 120 on a ground surface. For example, the leveling device 240 can be positioned between the frame 120 (and the enclosure 105 and a battery 115 positioned within the cavity 155 of the enclosure 105) and a ground surface to support the battery energy storage system 100. The leveling device 240 can extend from the frame 120 towards a ground surface (e.g., in a downwards direction). The leveling device 240 can extend from the frame 120 towards the ground surface at a variable distance. For example, the leveling device 240 can include a threaded post, a hydraulically or pneumatically-operated post that can extend or retract the leveling device 240 with respect to the frame 120 to alter a distance at which the leveling device 240 extends from the frame 120. The battery energy storage system 100 can include multiple leveling devices 240 (e.g., one positioned at or proximate to (e.g., within ten centimeters of) a corner of the frame 120. Each of the multiple leveling devices 240 can extend from the frame 120 at a different distance. For example, each of the leveling devices 240 can extend from the frame 120 at a specific distance in order to level the frame 120, the enclosure 105, or a battery 115 within the cavity 155 of the enclosure 105 with respect to a horizontal plane. Because the battery energy storage system 100 can be placed on an uneven or non-level surface, the leveling devices 240 can support the frame 120 with the frame 120, the enclosure 105, or a battery 115 within the cavity 155 of the enclosure 105 in a substantially level (e.g., ±15° from level) orientation.

As depicted in FIGS. 3 and 5-7, among others, the battery energy storage system 100 can include at least one battery 115. The battery 115 can be a single battery (e.g., a single battery cell), a battery module (e.g., a group of battery cells), or a battery pack (e.g., a group of battery modules or a group of battery cells). The battery 115 can be a battery cell, battery module, or battery pack from an electric vehicle. For example, the battery 115 can be used during a first life application as an energy source or energy storage means for an electric vehicle such as an electric car, truck, semi-truck, on-highway machine, off-highway machine, or other vehicle. The battery 115 can be a battery cell, module, or pack from some other application. The battery 115 can be a new battery, a used (e.g., previously used in another application), a reconditioned battery, or a battery in some other state. The battery 115 can be a lithium ion (Li-On) battery, a nickel-metal hydride (NiMH) battery, lead acid (SLA) battery, a solid state battery, a or some other type of energy storage device.

Figure 3:
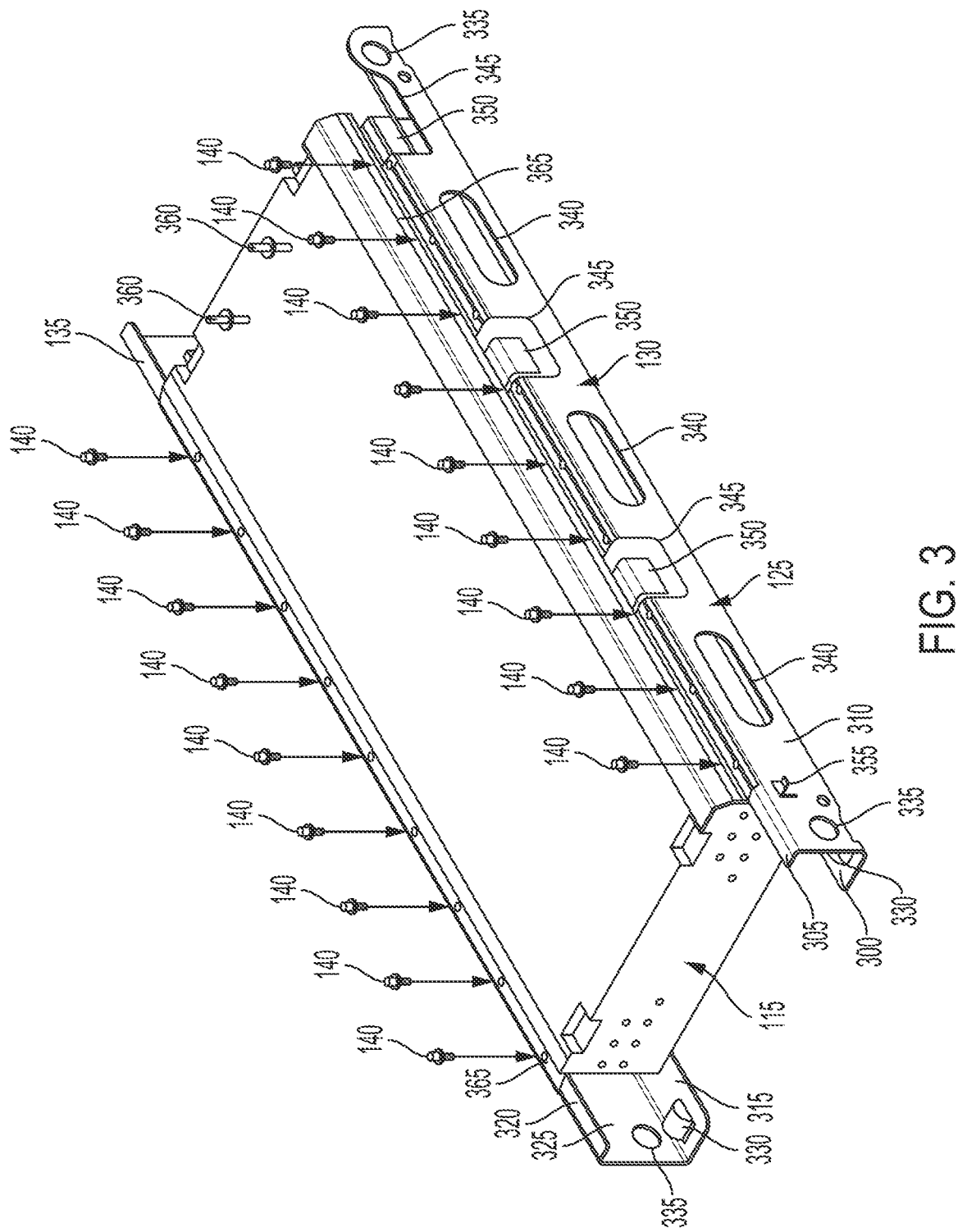
FIG. 3 depicts an example battery tray for a battery energy storage system, in accordance with some aspects.
Figure 5:
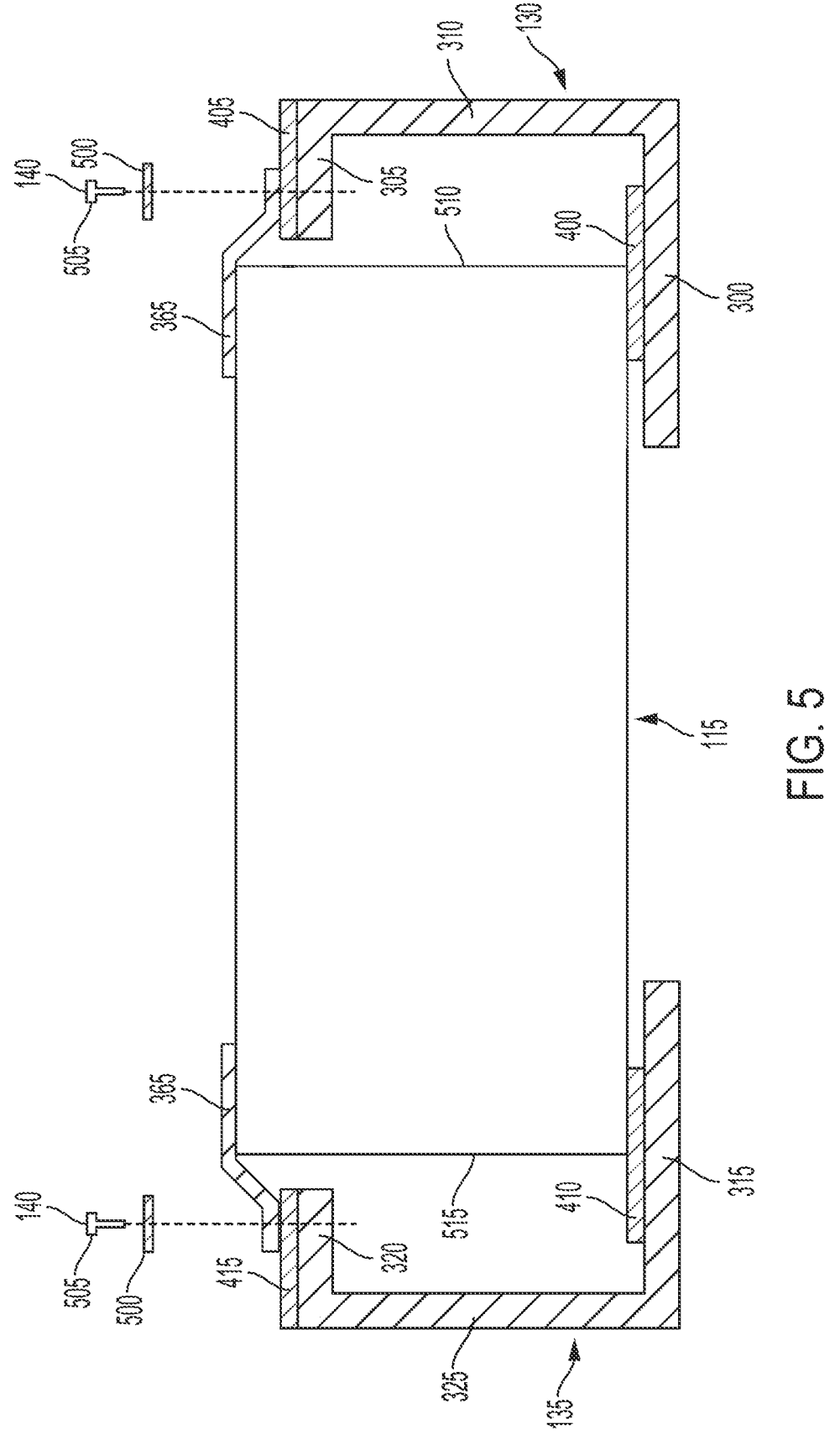
FIG. 5 depicts an example battery tray for a battery energy storage system, in accordance with some aspects.

The battery 115 can include at least one mounting flange 365. For example, the battery can include a first mounting flange 365 coupled with a top of the battery and positioned at or proximate to (e.g., within two centimeters of, within five centimeters of, or within some other distance of) a first side 510 of the battery 115. The battery 115 can include a second mounting flange 365 coupled with the top of the battery and positioned at or proximate to (e.g., within two centimeters of, within five centimeters of, or within some other distance of) a second side 515 of the battery 115. The mounting flange 365 can extend outwards from the top of the battery 115 to a respective side of the battery 115. As depicted in FIGS. 3 and 5, the first mounting flange 365 can extend from the top of the battery 115 in a first direction (e.g., to the right or to the left, as shown) and the second mounting flange 365 can extend from the top of the battery 115 in a second direction (e.g., to the left or to the right, as shown). As depicted in FIG. 3, among others, the mounting flange 365 can define a plurality of apertures. The plurality of apertures can receive a plurality of fasteners (e.g., fasteners 140) to secure the battery 115 to another object. For example, the mounting flange 365 can receive at least one fastener to secure or couple the battery 115 to a battery tray 125. The mounting flange 365 can be coupled with or integrated with the battery 115. For example, the battery 115 can include the mounting flange 365, where the mounting flange 365 can include a dimension, form factor, material composition, or other feature to couple the battery 115 with an electric vehicle in a first application (e.g., in the case where use in the battery energy storage system 100 is a second-life application for the battery 115).

The battery 115 can include at least one connector 350. For example, the battery 115 can include at least one electrical connector 350 to electrically couple the battery 115 with another device, system, or at least one electrical wire (e.g., a wiring harness). For example, the battery 115 can include an electrical connector 350 to electrically couple the battery 115 with the battery energy storage system 100 to provide the electrical energy stored within the battery 115 to the battery energy storage system 100. The battery energy storage system 100 can be electrically coupled with the battery 115 via at least one electrical wire or a wiring harness to draw electrical power from the battery 115 or to provide electrical power to the battery 115. For example, the battery energy storage system 100 can draw electrical energy from the battery 115 to provide electrical energy to another device or system (e.g., a building, medical equipment, manufacturing equipment, or other equipment). The battery 115 can include multiple connectors 350. The battery energy storage system 100 can include multiple electrical wires or wiring harnesses to electrically couple the battery energy storage system 100 with multiple batteries 115. At least one of the electrical wires or wiring harnesses can be coupled with the batteries 115 via the passage 220 of the spine member 215.

The battery 115 can include at least one cooling port 360. For example, the battery 115 can include a cooling inlet port 360 and a cooling outlet port 360. The cooling inlet port 360 can receive coolant to provide cooling energy to the battery 115. For example, the battery 115 can include at least one cooling conduit or passageway within the battery 115 that can facilitate a flow of coolant (e.g., water, ethylene glycol, or some other cooling fluid) through the battery 115 or around the battery 115 to reduce a temperature of the battery 115. Coolant can be received from a cooling device (as discussed below) via the cooling inlet port 360. Coolant can be exit the cooling conduit or passageway via the cooling outlet port 360. The cooling outlet port 360 can be fluidly coupled with a cooling device to provide used coolant to the cooling device, for example.

The battery energy storage system 100 can include at least one auxiliary tray 145. For example, the battery energy storage system 100 can include the auxiliary tray 145 to support an auxiliary device 150. The auxiliary device 150 can be a cooling device 150 or a control device 150. The battery energy storage system 100 can include the auxiliary tray 145 to support an electronic control device 150. For example, the battery energy storage system 100 can include an auxiliary tray 145 to support a cooling device 150 to provide cooling energy to the battery 115 or the cavity 155 of the enclosure 105. The cooling device 150 can circulate coolant, air, or some other fluid to cool the battery 115 or any other component within the cavity 155 of the enclosure 105. For example, the cooling device 150 can circulate coolant to a battery 115. The cooling device 150 can be fluidly coupled with at least one coolant port 360 of the battery 115 to provide coolant (e.g., a cooling fluid such as water, ethylene glycol, or some other fluid) to the battery 115. For example, the cooling device 150 can circulate coolant through cooling elements within the battery via the cooling port 360 to reduce a temperature of the battery 115. At least one fluid conduit can extend from the cooling device 150 supported by the auxiliary tray (or otherwise positioned within or without the cavity 155 of the enclosure 105) to at least one battery 115. For example, an inlet fluid conduit can extend from the cooling device 150 to the cooling inlet port 360 and an outlet fluid conduit can extend from the cooling device 150 to the cooling outlet port 360. The fluid conduit (e.g., the inlet fluid conduit or the outlet fluid conduit) can be extend from the cooling device 150 to the battery 115 via the passage 220 of the spine member 215.

The auxiliary tray 145 can support a control device 150. For example, the auxiliary tray can support a control device 150 configured to control the operation of the battery energy storage system 100. The control device 150 could be a computing system, a controller, or some other device configured to communicate with the battery 115 of the battery energy storage system 100 and other devices communicably coupled with the battery energy storage system 100 (e.g., a device receiving a charge from the battery energy storage system 100). The control device 150 can be configured to determine, among other things, whether the frame 120 or some other portion of the enclosure 105 becomes incidentally energized by a battery 115 or by a device electrically coupled with the battery energy storage system 100. For example, the control device 150 can disconnect the battery (e.g., sever an electrical connection with the battery) or can command the battery 115 to cease providing electrical energy in response to a determination that the frame 120 or other component of the battery energy storage system 100 becomes energized or potentially energized in advertently.

The auxiliary tray 145 can be supported by a surface 235 of at least one rail 230 of the frame 120. For example, the auxiliary tray 145 can include at least one roller or rolling element that can be slidably received by the rail 230 of the frame such that the auxiliary tray 145 can be slid into or out of the cavity 155 of the enclosure 105. The auxiliary tray 145 can be supported by a surface 235 of each of two rails 230, where the rails 230 collectively define a horizontal or substantially horizontal (e.g., ±15° from horizontal) surface. The battery energy storage system 100 can include two or more auxiliary trays 145. For example, the battery energy storage system 100 can include a first auxiliary tray 145 to support the cooling device 150 or other components and a second auxiliary tray 145 to support the control device 150 or other components.

The battery energy storage system 100 can include at least one battery tray 125. For example, the battery energy storage system 100 can include a battery tray 125 to support a battery 115 with the battery tray 125 within the cavity 155 of the enclosure 105. At least one rail 230 of the frame 120 can support the battery tray 125. For example, the rail 230 can include or define the horizontal surface 235 extending from the first member 200 or the spine member 215 of the frame 120 towards a center of the cavity 155. The surface 235 can extend from the first member 200 or the spine member 215 at a distance (e.g., five centimeters, more than five centimeters, less than five centimeters). The battery tray 125 can be supported by the surface 235 of the rail 230 with the rail 230 coupled with the first member 200 or other member (e.g., spine member 215, second member 205, third member 210, or some other member of the frame 120). The battery tray 125 can be supported by two rails 230. For example, the surfaces 235 of a pair of rails 230 can support the battery tray 125. A first side of the battery tray 125 (e.g., the first member 130) can be supported by a first surface 235 of the first rail 230 of the pair of rails 230. A second side of the battery tray 125 (e.g., the second member 135) can be supported by a second surface 235 of the second rail 230 of the pair of rails 230.

The battery energy storage system 100 can include the battery tray 125 to support a battery 115. For example, the battery energy storage system 100 can include a tray 125 to support a battery 115 with the tray 125 positioned within the cavity 155 of the enclosure 105. The tray 125 can support the battery 115 with the battery tray 125 supported by a surface 235 of a rail 230. The battery tray 125 can support the battery 115 with the tray 125 coupled with the battery 115. For example, the battery 115 can be coupled with the tray 125 via one or more fasteners, adhesive, or some other attachment mechanism. The battery energy storage system 100 can include multiple battery trays 125 to support multiple batteries 115. For example, the battery energy storage system 100 can include more than one battery tray 125 to support more than one battery 115.

The battery energy storage system 100 can include the tray 125 with the tray 125 including a first member 130 and a second member 135. For example, the tray 125 can be formed by the first member 130 and the second member 135 coupled with a battery 115. The tray 125 can include the first member 130 separate from the second member 135 such that the first member 130 is not integrated with (e.g., directly joined to, forming part of the same whole, or otherwise integrally formed) with the second member 135. The tray 125 can include the first member 130 coupled with or integrally formed with the second member 135. For example, the tray 125 can include the first member 130 directly coupled with the second member 135 such that the tray 125 is a single member. The tray 125 can include the first member 130 coupled with the second member 135 via some intervening components. For example, a central member can be positioned between the first member 130 and the second member 135, with the first member 130 and the second member 135 coupled with the central portion.

As depicted in FIGS. 3-7, among others, the battery energy storage system 100 can include the first member 130 of the tray 125 including a first lower portion 300 and a first upper portion 305. For example, the first member 130 can include the first lower portion 300 and the first upper portion 305 extending from a first side portion 310. The first member 130 can include a C-shaped cross-sectional form factor, a J-shaped cross-sectional form factor, or some other cross-sectional form factor. For example, the first upper portion 305 can extend parallel or substantially parallel (e.g., ±15° from parallel) to the first lower portion 300. In other examples, the first upper portion 305 and the first lower portion 300 can be non-parallel. The first side portion 310 can be perpendicular or substantially perpendicular to the first upper portion 305 and the first lower portion 300. The first upper portion 305 can extend from the first side portion 310 at a distance that is similar to or different than a distance at which the first lower portion 300 extends from the first side portion 310. For example, the first lower portion 300 can extend from the first side portion 310 at a first distance that is greater than a second distance at which the first upper portion 305 extends from the first side portion 310. The first upper portion 305, the first side portion 310, and the first lower portion 300 can include a cross-sectional thickness that is the same as or different than a cross-sectional thickness one or more of the first side portion 310, the first lower portion 300, or the first upper portion 305. The first upper portion 305 can define at least one aperture or can include at least one fastener (e.g., a bolt, screw, rivet, or other fastener). For example, the first upper portion 305 can include at least one aperture to receive a fastener (e.g., bolt, screw, rivet, or other fastener) to secure or couple the battery 115 with the first upper portion 305. The first upper portion 305 can include at least one fastener protruding from the second upper portion 320, the fastener to be received by an aperture defined by the mounting flange 365 of the battery 115 to couple the battery 115 with the second upper portion 320, as discussed below.

The battery energy storage system 100 can include the second member 135 of the tray 125 including a second lower portion 315 and a second upper portion 320. The second member 135 can include a cross-sectional shape that is a mirror image or substantially a mirror image (e.g., ±75% similar) to a cross-sectional shape of the first member 130. For example, the second member 135 can include the second lower portion 315 and the second upper portion 320 extending from a second side portion 325. The second member 135 can include a C-shaped cross-sectional form factor, a J-shaped cross-sectional form factor, or some other cross-sectional form factor. For example, the second upper portion 320 can extend parallel or substantially parallel (e.g., ±15° from parallel) to the second lower portion 315. In other examples, the second upper portion 320 and the second lower portion 315 can be non-parallel. The second side portion 325 can be perpendicular or substantially perpendicular to the second upper portion 320 and the second lower portion 315. The second upper portion 320 can extend from the second side portion 325 at a distance that is similar to or different than a distance at which the second lower portion 315 extends from the second side portion 325. For example, the second lower portion 315 can extend from the second side portion 325 at a third distance that is greater than a fourth distance at which the second upper portion 320 extends from the second side portion 325. The second upper portion 320, the second side portion 325, and the second lower portion 315 can include a cross-sectional thickness that is the same as or different than a cross-sectional thickness one or more of the second side portion 325, the second lower portion 315, or the second upper portion 320. The second upper portion 320 can define at least one aperture or can include at least one fastener (e.g., a bolt, screw, rivet, or other fastener). For example, the second upper portion 320 can include at least one aperture to receive a fastener (e.g., bolt, screw, rivet, or other fastener) to secure or couple the battery 115 with the second upper portion 320. The second upper portion 320 can include at least one fastener protruding from the second upper portion 320, the fastener to be received by an aperture defined by the mounting flange 365 of the battery 115 to couple the battery 115 with the second upper portion 320, as discussed below.

The battery energy storage system 100 can include the first lower portion 300 of the first member 130 to support the battery 115. For example, the first lower portion 300 can support a bottom of the battery 115 with the battery 115 coupled with the tray 125. The first lower portion 300 can extend from the first side portion 310 underneath the battery 115 such that a weight of the battery 115 can be supported by the first lower portion 300 with the battery 115 coupled with the tray 125. For example, the first lower portion 300 can be a ledge, surface, or plate upon which a first portion of the battery 115 can be supported (e.g., contact, rest, be placed). The first lower portion 300 of the first member 130 can directly contact the battery 115 with the battery 115 coupled with the tray 125 such that an outer surface of the battery 115 directly contacts the first lower portion 300 without any other components therebetween. The first lower portion 300 of the first member 130 can indirectly contact the battery 115 with the battery 115 coupled with the tray 125 such that at least one intervening component (e.g., a first insulative element 400) is positioned between the battery 115 and the first lower portion 300. The first lower portion 300 can extend under the battery 115 for a distance such that the battery 115 is supported by an area of the first lower portion 300 to distribute a weight of the battery 115 over the area of the first lower portion 300.

The battery energy storage system 100 can include the first lower portion 300 of the first member 130 to support the battery 115 with a first insulative element 400 positioned between the battery 115 and the first lower portion 300. For example, the first insulative element 400 can be positioned between the battery 115 and the first lower portion 300 such that the battery 115 does not directly contact the first lower portion 300. Rather, the battery 115 can contact the first insulative element 400, and the first insulative element 400 can contact the first lower portion 300 of the first member 130. The first insulative element 400 can be or include an electrically insulative material or chemical composition. For example, the first insulative element 400 can be or include an EPDM (ethylene propylene diene monomer) rubber material, other rubber materials, a ceramic material, a glass material, a polymeric or plastic material, a glass material, or some other material. The first insulative element 400 can be or include an electrically insulative material electrically insulate the battery 115 from the first lower portion 300 of the first member 130. The first insulative element 400 can electrically isolate the battery 115 from the first member 130. For example, the electricity cannot pass or flow from the battery 115 to the first member 130 or from the first member 130 to the battery 115 with the first insulative element 400 positioned between the battery 115 and the first lower portion 300.

The first insulative element 400 can be coupled with the first lower portion 300. For example, the first insulative element 400 can be fastened to, adhered to (e.g., with an adhesive), or otherwise joined with the first lower portion 300. The first insulative element 400 can be integrated with the first lower portion 300. The first lower portion 300 itself can be the first insulative element 400. The first insulative element 400 can span an area of the first lower portion 300 such that no portion of the battery 115 contacts the first lower portion 300, but rather the battery 115 contacts only the first insulative element 400. For example, the first insulative element 400 can span an entire length or substantially an entire length (e.g., ±75% of the length) of the first lower portion 300. The first insulative element 400 can span substantially an entire length of multiple segments of the first lower portion 300 with the first lower portion 300 being discontinuous (e.g., including multiple discrete segments).

The battery energy storage system 100 can include the second lower portion 315 of the second member 135 to support the battery 115. For example, the second lower portion 315 can support a bottom of the battery 115 with the battery 115 coupled with the tray 125. The second lower portion 315 can extend from the second side portion 325 underneath the battery 115 such that a weight of the battery 115 can be supported by the second lower portion 315 with the battery 115 coupled with the tray 125. For example, the second lower portion 315 can be a ledge, surface, or plate upon which the battery 115 can be supported (e.g., contact, rest, be placed). The second lower portion 315 of the second member 135 can directly contact the battery 115 with the battery 115 coupled with the tray 125 such that an outer surface of the battery 115 directly contacts the second lower portion 315 without any other components therebetween. The second lower portion 315 of the second member 135 can indirectly contact the battery 115 with the battery 115 coupled with the tray 125 such that at least one intervening component (e.g., a third insulative element 410) is positioned between the battery 115 and the second lower portion 315. The second lower portion 315 can extend under the battery 115 for a distance such that the battery 115 is supported by an area of the second lower portion 315 to distribute a weight of the battery 115 over the area of the second lower portion 315.

The battery energy storage system 100 can include the second lower portion 315 of the second member 135 to support the battery 115 with a third insulative element 410 positioned between the battery 115 and the second lower portion 315. For example, the third insulative element 410 can be positioned between the battery 115 and the second lower portion 315 such that the battery 115 does not directly contact the second lower portion 315. Rather, the battery 115 can contact the third insulative element 410, and the third insulative element 410 can contact the second lower portion 315 of the second member 135. The third insulative element 410 can be or include an electrically insulative material or chemical composition. For example, the third insulative element 410 can be or include an EPDM (ethylene propylene diene monomer) rubber material, other rubber materials, a ceramic material, a glass material, a polymeric or plastic material, a glass material, or some other material. The third insulative element 410 can be or include an electrically insulative material electrically insulate the battery 115 from the second lower portion 315 of the second member 135. The third insulative element 410 can electrically isolate the battery 115 from the second member 135. For example, the electricity cannot pass or flow from the battery 115 to the second member 135 or from the second member 135 to the battery 115 with the third insulative element 410 positioned between the battery 115 and the second lower portion 315.

The third insulative element 410 can be coupled with the first upper portion 305. For example, the third insulative element 410 can be fastened to, adhered to (e.g., with an adhesive), or otherwise joined with the first upper portion 305. The third insulative element 410 can be integrated with the first upper portion 305. The second lower portion 315 itself can be the third insulative element 410. The third insulative element 410 can span an area of the second lower portion 315 such that no portion of the battery 115 contacts the second lower portion 315, but rather the battery 115 contacts only the third insulative element 410. For example, the third insulative element 410 can span an entire length or substantially an entire length (e.g., ±75% of the length) of the second lower portion 315. The third insulative element 410 can span substantially an entire length of multiple segments of the second lower portion 315 with the second lower portion 315 being discontinuous (e.g., including multiple discrete segments).

The battery energy storage system 100 can include the battery 115 coupled with the first upper portion 305 of the first member 130. For example, the first upper portion 305 can be coupled with the mounting flange 365 of the battery 115. The mounting flange 365 can extend from the top of the battery 115 to one side of the battery such that the mounting flange 365 extends away from the battery 115. The first upper portion 305 can extend from the first side portion 310 towards the battery 115 with the battery 115 supported by the first lower portion 300 of the first member 130. The mounting flange 365 can define at least one aperture to receive a fastener. The mounting flange 365 of the battery 115 can include at least one fastener to be received by another aperture (e.g., an aperture defined by the first upper portion 305). The first upper portion 305 can define at least one aperture to receive a fastener. The first upper portion 305 can include at least one aperture to be received by another aperture (e.g., an aperture defined by the mounting flange 365). For example, the first upper portion 305 can define multiple apertures that correspond with multiple apertures defined by the mounting flange 365. At least one of the apertures of the mounting flange 365 can align with at least one aperture of the first upper portion 305. A fastener 140 can be received by the aperture of the mounting flange 365 and the aperture of the first upper portion 305. For example, a fastener 140 can be inserted into (e.g., have a shank extending through, be threaded into) at least one aperture of the mounting flange 365 and also inserted into at least one aperture of the first upper portion 305. A fastening element (e.g., nut) can be secured to the fastener 140 to secure the mounting flange 365 to the first upper portion 305. For example, the mounting flange 365 can include multiple apertures (e.g., five to twenty) that correspond (e.g., are coaxial with) with the same or a similar (e.g., ±75%) amount of apertures of the first upper portion 305.

The battery energy storage system 100 can include the first upper portion 305 coupled with the mounting flange 365 with a second insulative element 405 positioned between the first upper portion 305 and the mounting flange 365. For example, the second insulative element 405 can be positioned between the mounting flange 365 of the battery 115 and the first upper portion 305 such that the mounting flange 365 does not directly contact the first upper portion 305. Rather, the mounting flange 365 can contact the second insulative element 405, and the second insulative element 405 can contact the first upper portion 305 of the first member 130. The second insulative element 405 can be or include an electrically insulative material or chemical composition. For example, the second insulative element 405 can be or include an EPDM (ethylene propylene diene monomer) rubber material, other rubber materials, a ceramic material, a glass material, a polymeric or plastic material, a glass material, or some other material. The second insulative element 405 can be or include an electrically insulative material electrically insulate the mounting flange 365 and the battery 115 from the first upper portion 305 of the first member 130. The second insulative element 405 can electrically isolate the battery 115 from the first member 130. For example, electricity cannot pass or flow from the battery 115 or mounting flange 365 to the first member 130 or from the first member 130 to the battery 115 or mounting flange 365 with the second insulative element 405 positioned between the mounting flange 365 and the first upper portion 305.

The second insulative element 405 can be coupled with the first upper portion 305. For example, the second insulative element 405 can be fastened to, adhered to (e.g., with an adhesive), or otherwise joined with the first upper portion 305. The second insulative element 405 can be integrated with the first upper portion 305. The first upper portion 305 itself can be the second insulative element 405. The second insulative element 405 can span an area of the first upper portion 305 such that no portion of the battery 115 contacts the first upper portion 305, but rather the battery 115 contacts only the second insulative element 405. For example, the second insulative element 405 can span an entire length or substantially an entire length (e.g., ±75% of the length) of the first upper portion 305. The second insulative element 405 can span substantially an entire length of multiple segments of the first upper portion 305 with the first upper portion 305 being discontinuous (e.g., including multiple discrete segments).

The battery energy storage system 100 can include the first upper portion 305 defining an aperture to receive a fastener 140. For example, the first upper portion 305 can define an aperture that corresponds with an aperture of the mounting flange 365. The aperture of the first upper portion 305 and the aperture of the mounting flange 365 can receive the fastener 140 to couple the mounting flange 365 with the first upper portion. The fastener 140 can include or can be coupled with an insulative washer 500. The insulative washer 500 can be positioned between a head 505 of the fastener 140 and the mounting flange 365 with the fastener 140 coupling the mounting flange 365 with the first upper portion 305. The insulative washer 500 can be or include an electrically insulative material (e.g., EPDM rubber, another rubber material, a ceramic material, a glass material, a polymeric or plastic material, a glass material, or some other material). For example, the fastener 140 can be electrically isolated from the battery 115 such that no electricity can pass or flow between the battery 115 and the fastener 140 with the insulative washer 500 positioned therebetween. The insulative washer 500 can electrically insulate the battery 115 from the first upper portion 305 to electrically isolate the battery 115 from the first member 130.

The battery energy storage system 100 can include the battery 115 coupled with the second upper portion 320 of the second member 135. For example, the first upper portion 305 can be coupled with the mounting flange 365 of the battery 115. The mounting flange 365 can extend from the top of the battery 115 to one side of the battery such that the mounting flange 365 extends away from the battery 115. The second upper portion 320 can extend from the second side portion 325 towards the battery 115 with the battery 115 supported by the second lower portion 315 of the second member 135. The mounting flange 365 can define at least one aperture to receive a fastener. The mounting flange 365 of the battery 115 can include at least one fastener to be received by another aperture (e.g., an aperture defined by the second upper portion 320). The second upper portion 320 can define at least one aperture to receive a fastener. The second upper portion 320 can include at least one aperture to be received by another aperture (e.g., an aperture defined by the mounting flange 365). For example, the second upper portion 320 can define multiple apertures that correspond with multiple apertures defined by the mounting flange 365. At least one of the apertures of the mounting flange 365 can align with at least one aperture of the second upper portion 320. A fastener 140 can be received by the aperture of the mounting flange 365 and the aperture of the second upper portion 320. For example, a fastener 140 can be inserted into (e.g., have a shank extending through, be threaded into) at least one aperture of the mounting flange 365 and also inserted into at least one aperture of the second upper portion 320. A fastening element (e.g., nut) can be secured to the fastener 140 to secure the mounting flange 365 to the first upper portion 305. For example, the mounting flange 365 can include multiple apertures (e.g., five to twenty) that correspond (e.g., are coaxial with) with the same or a similar (e.g., ±75%) amount of apertures of second upper portion 320.

The battery energy storage system 100 can include the second upper portion 320 coupled with the mounting flange 365 with a fourth insulative element 415 positioned between second upper portion 320 and the mounting flange 365. For example, the fourth insulative element 415 can be positioned between the mounting flange 365 of the battery 115 and second upper portion 320 such that the mounting flange 365 does not directly contact second upper portion 320. Rather, the mounting flange 365 can contact the fourth insulative element 415, and the fourth insulative element 415 can contact second upper portion 320 of the second member 135. The fourth insulative element 415 can be or include an electrically insulative material or chemical composition. For example, the fourth insulative element 415 can be or include an EPDM (ethylene propylene diene monomer) rubber material, other rubber materials, a ceramic material, a glass material, a polymeric or plastic material, a glass material, or some other material. The fourth insulative element 415 can be or include an electrically insulative material electrically insulate the mounting flange 365 and the battery 115 from second upper portion 320 of the second member 135. The fourth insulative element 415 can electrically isolate the battery 115 from the second member 135. For example, electricity cannot pass or flow from the battery 115 or mounting flange 365 to the second member 135 or from the second member 135 to the battery 115 or mounting flange 365 with the fourth insulative element 415 positioned between the mounting flange 365 and second upper portion 320.

The fourth insulative element 415 can be coupled with the second upper portion 320. For example, the fourth insulative element 415 can be fastened to, adhered to (e.g., with an adhesive), or otherwise joined with the second upper portion 320. The fourth insulative element 415 can be integrated with the second upper portion 320. The second upper portion

320 itself can be the fourth insulative element 415. The fourth insulative element 415 can span an area of the second upper portion 320 such that no portion of the battery 115 contacts the second upper portion 320, but rather the battery 115 contacts only the fourth insulative element 415. For example, the fourth insulative element 415 can span an entire length or substantially an entire length (e.g., ±75% of the length) of the second upper portion 320. The fourth insulative element 415 can span substantially an entire length of multiple segments of the second upper portion 320 with the second upper portion 320 being discontinuous (e.g., including multiple discrete segments).

The battery energy storage system 100 can include the second upper portion 320 defining an aperture to receive a fastener 140. For example, the second upper portion 320 can define an aperture that corresponds with an aperture of the mounting flange 365. The aperture of the second upper portion 320 and the aperture of the mounting flange 365 can receive the fastener 140 to couple the mounting flange 365 with the second upper portion 320. The fastener 140 can include or can be coupled with an insulative washer 500. The insulative washer 500 can be positioned between a head 505 of the fastener 140 and the mounting flange 365 with the fastener 140 coupling the mounting flange 365 with the second upper portion 320. The insulative washer 500 can be or include an electrically insulative material (e.g., EPDM rubber, another rubber material, a ceramic material, a glass material, a polymeric or plastic material, a glass material, or some other material). For example, the fastener 140 can be electrically isolated from the battery 115 such that no electricity can pass or flow between the battery 115 and the fastener 140 with the insulative washer 500 positioned therebetween. The insulative washer 500 can electrically insulate the battery 115 from the second upper portion 320 to electrically isolate the battery 115 from the second member 135.

Figure 4:
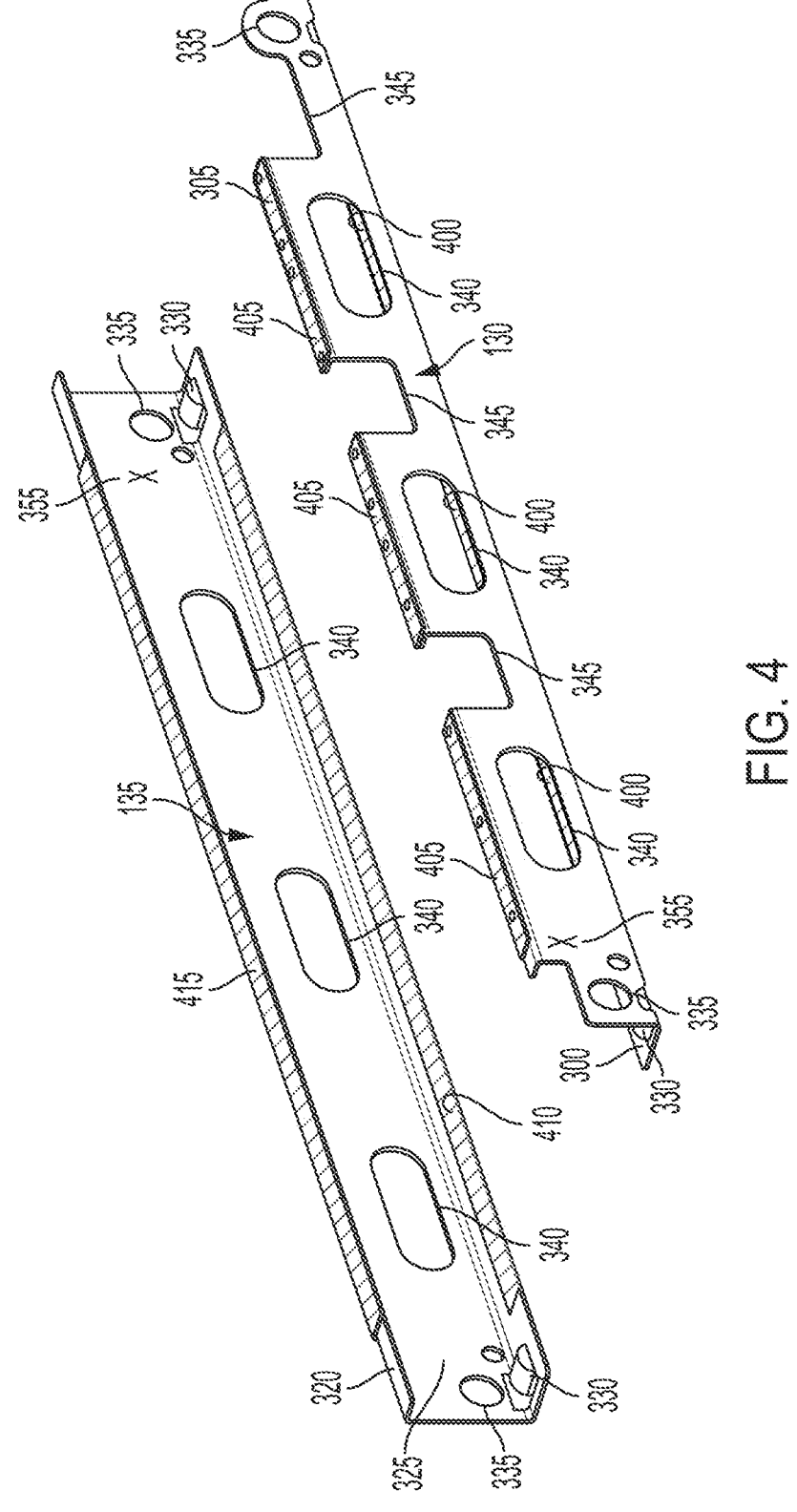
FIG. 4 depicts an example battery tray for a battery energy storage system, in accordance with some aspects.

The battery energy storage system 100 can include the first member 130 and the second member 135 to interact with the frame 120 of the battery energy storage system 100. For example, the first member 130 and the second member 135 can be supported by the surface 235 of a pair of rails 230 with the rails 230 coupled with the frame 120. The rails 230 can support the first member 130 and the second member 135 with the first member 130 and the second member 135 coupled with the battery 115. The first member 130 can include at least one roller 330 to facilitate a movement of the first member 130 with respect to the frame 120. For example, the first lower portion 300 can be rotatably coupled with a roller 330. The roller 330 can extend beneath a bottom surface of the first lower portion 300 such that the roller 330 contacts the surface 235 of the rail 230 rather than the first lower portion 300 itself. The roller 330 can be or include at least one bearing (e.g., pin, ball bearing, pillow block, or other bearing device) to facilitate a rotational movement of the roller 330 with respect to the first lower portion 300. As depicted in FIGS. 3 and 4, the first member 130 can include a first roller 330 and a second roller 330, with the first roller positioned at or proximate to (e.g., within two centimeters of, within five centimeters of, within ten centimeters of, or within some other distance of) one end of the first member 130 and the second roller 330 positioned at or proximate to (e.g., within two centimeters of, within five centimeters of, within ten centimeters of, or within some other distance of) another end of the first member 130. The roller 330 can be positioned along the first lower portion 300 such that the roller 330 contacts the surface 235 with the first member 130 supported by the surface 235. For example, the roller 330 can have a width that is entirely supported by (e.g., contacts) the surface 235.

The second member 135 can include at least one roller 330 to facilitate a movement of the second member 135 with respect to the frame 120. For example, the first lower portion 300 can be rotatably coupled with a roller 330. The roller 330 can extend beneath a bottom surface of the second lower portion 315 such that the roller 330 contacts the surface 235 of the rail 230 rather than the second lower portion 315 itself. The roller 330 can be or include at least one bearing (e.g., pin, ball bearing, pillow block, or other bearing device) to facilitate a rotational movement of the roller 330 with respect to the second lower portion 315. As depicted in FIGS. 3 and 4, the second member 135 can include a first roller 330 and a second roller 330, with the first roller positioned at or proximate to (e.g., within two centimeters of, within five centimeters of, within ten centimeters of, or within some other distance of) one end of the second member 135 and the second roller 330 positioned at or proximate to (e.g., within two centimeters of, within five centimeters of, within ten centimeters of, or within some other distance of) another end of the second member 135. The roller 330 can be positioned along the first lower portion 300 such that the roller 330 contacts the surface 235 with the first member 130 supported by the surface 235. For example, the roller 330 can have a width that is entirely supported by (e.g., contacts) the surface 235.

Figure 8:
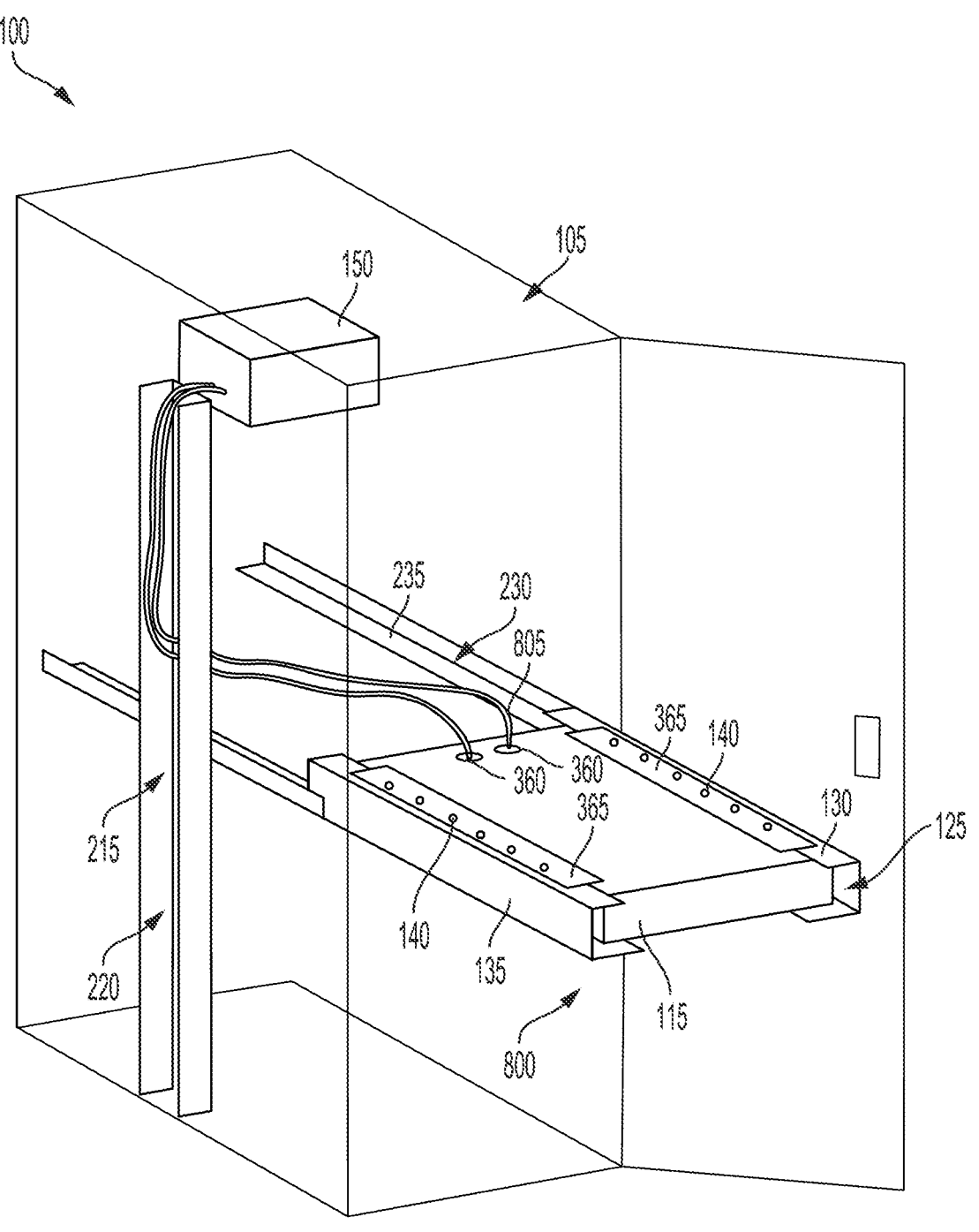
FIG. 8 depicts an example battery tray for a battery energy storage system, in accordance with some aspects.

As depicted in FIG. 8, among others, the battery energy storage system 100 can include the tray 125 to move to a maintenance position 800. For example, the first member 130 and the second member 135 can include at least one roller 330. The roller 330 can facilitate a movement of the first member 130, the second member 135, and the tray 125 along at least one surface 235 of at least one rail 230. For example, the roller 330 can facilitate a movement of the tray 125 along the rail 230 into or out of the cavity 160 of the enclosure 105. The battery 115 and the tray 125 can be in an installed position (e.g., a position depicted in FIG. 1, among others) with the tray 125 inserted into the cavity 160 of the enclosure 105. For example, the battery 115 and the tray 125 can be enclosed within the cavity 160 of the enclosure 105 with the tray 125 in the installed position such that the panel 110 (e.g., door) of the enclosure can be closed. The battery energy storage system 100 can include the battery 115 and the tray 125 in a maintenance position 800. For example, the maintenance position 800 can be an orientation of the battery 115 and the tray 125 where the battery 115 is at least partially accessible from an exterior of the enclosure 105 such that maintenance or some other operation can be performed on the battery 115. For example, the cooling port 360 of the battery 115 can be accessible (e.g., within fifty centimeters of an operator) with the tray 125 in the maintenance position 800. The tray 125 and the battery 115 can translate along the rail 230 from the installed position to the maintenance position 800. The battery 115 and the tray 125 can at least partially protrude out of the cavity 160 with the tray 125 in the maintenance position 800.

The battery energy storage system 100 can include the cooling port 360 and at least one conduit 805 accessible with the tray 125 in the maintenance position 800. For example, the battery 115 and the tray 125 can at least partially protrude from the cavity 160 with the tray 125 in the maintenance position 800. The battery 115 can protrude from the cavity 160 such that at least a portion of the battery 115 is accessible (e.g., within twenty centimeters, within fifty centimeters) of an operator standing near (e.g., next to, adjacent to, within fifty centimeters of) the tray 125 with the tray 125 in the maintenance position 800. For example, the cooling port 360 can be within arms' reach of an operator with the tray 125 in the maintenance position 800 such that an operator can reach the cooling port 360 and conduit 805 coupled therewith.

As depicted in FIG. 8, among others, the battery energy storage system 100 can include at least one conduit 805 to extend from the cooling device 150 to the battery 115 via the passage 220. For example, the spine member 215 can define a passage 220 to receive a fluid or electrical conduit from the auxiliary device 150 on the auxiliary tray 145 of the battery energy storage system 100. The conduit 805 can be a fluid conduit 805 to provide cooling fluid (e.g., coolant, water, ethylene glycol water solution, or some other fluid) to the battery 115 from the auxiliary device 150 (e.g., a cooling device 150). The conduit 805 can be an electrical conduit (e.g., at least one electrical wire, a wiring harness, or some other electrical connector) to facilitate an electrical connection between the battery 115 and an auxiliary device 150 (e.g., a control device 150). The conduit 805 can extend through the passage 220 of the spine member 215 from the auxiliary tray 145 or some other location within or without the enclosure to at least one battery 115. The spine member 215 can define at least one aperture or opening. The conduit 805 can pass from the passage 220 through the aperture to the battery, as depicted in FIG. 8.

The battery energy storage system 100 can include an electrical connector 350 of the battery 115 accessible with the tray 125 in the maintenance position 800. For example, the connector 350 of the battery 115 can be positioned along the first side 510, the second side 515, a top, or a bottom of the battery 115 such that the connector 350 is within the cavity 160 of the enclosure 105 with the tray 125 in the installed position. The connector 350 can be at least partially accessible with the tray 125 in the maintenance position 800. For example, the tray 125 and the battery 115 can at least partially protrude from the cavity 160 with the tray 125 in the maintenance position 800. An operator standing near (e.g., adjacent to, next to, within fifty centimeters of) the battery 115 and tray 125 can reach the connector 350 to electrically couple or decouple the battery 115 from the control device 150 with the tray 125 in the maintenance position 800.

The battery energy storage system 100 can include the first insulative element 400, the second insulative element 405, the third insulative element 410, and the fourth insulative element 415 to electrically isolate the battery 115 from the frame 120 of the battery energy storage system 100. For example, as discussed above, the battery 115 can be electrically isolated from the first member 130 with the first insulative element 400 positioned between the battery 115 and the first lower portion 300 and the second insulative element 405 positioned between the mounting flange 365 of the battery 115 and the first upper portion 305. The battery 115 can be electrically isolated from the second member 135 with the third insulative element 410 positioned between the battery 115 and the second lower portion 315 and the fourth insulative element 415 positioned between the battery 115 and the second upper portion 320. Because the battery 115 can be electrically isolated from the first member 130 and the second member 135, the battery 115 can also be electrically isolated from the rails 230 and the frame 120 of the battery energy storage system 100 with the first insulative element 400 positioned between the battery 115 and the first lower portion 300, the second insulative element 405 positioned between the mounting flange 365 of the battery 115 and the first upper portion 305, the third insulative element 410 positioned between the battery 115, and the second lower portion 315 and the fourth insulative element 415 positioned between the battery 115 and the second upper portion 320.

As depicted in FIGS. 3 and 4, among others, the first member 130 or the second member 135 can include at least one hoisting aperture 335, at least one grasping device 340, at least one opening 345, and at least one identifier 355. For example, the first member 130 can include at least one hoisting aperture 335 formed in at least one of the first lower portion 300, the first side portion 310, or the first upper portion 305. The hoisting aperture 335 can be an aperture defined by the first member 130 and configured to receive a hook, prong, or finger of a hoisting mechanism (e.g., an overhead crane, a mechanical hoist, or other device). The hoisting aperture 335 can provide a location for a hoisting mechanism to temporarily couple with the tray 125 and battery 115 to move the tray 125 and battery 115 without inadvertently causing damage to the tray 125, the battery 115, or otherwise.

The first member 130 or the second member 135 can include the grasping device 340 to facilitate a movement of the tray 125 or the battery 115. For example, the grasping device 340 can be an aperture or cutout formed in the first side portion 310 of the first member 130 to allow a hand of an operator (e.g., a person, a user, or other individual) to grasp the tray 125. The grasping device 340 can be a handle or other member protruding from the first side portion 310 of the first member 130 to provide a grasping location for a user. The first member 130 or the second member 135 can include multiple grasping devices 340 positioned at various positions on the first member 130 or the second member 135 (e.g., on the first lower portion 300, the first upper portion 305, or the first side portion 310) so that a user can grasp the tray 125 to facilitate a movement of the tray 125. For example, an operator may grasp one or more grasping devices 340 to slide or translate the tray 125 and battery 115 into or out of the cavity 155 of the enclosure 105.

The first member 130 or the second member 135 can include at least one opening 345. For example, the first member 130 can include at least one opening 345 to provide access to the connector 350 of the battery 115 with the battery 115 coupled with the first member 130 of the tray 125. The first member 130 can include at least one opening 345 corresponding to each connector 350 of the battery 115. For example, the battery 115 can include two or more connectors 350, and the first member 130 can include two or more openings 345 such that each connector 350 can be accessed with the battery 115 coupled with the first member 130. The opening 345 can be an aperture or a cutout of one or more of the first side portion 310, the first lower portion 300, or the first upper portion 305. The opening 345 can provide access for an electrical wire or wiring harness of the battery energy storage system 100 to be coupled with the connector 350.

The first member 130 or the second member 135 can include at least one identifier 355. For example, the first member 130 and the second member 135 can each include a visual identifier, RFID transmitter, or other electronic identifier formed in or coupled to the first member 130 and the second member 135, respectively. The identifier can be a 2D barcode, a QR code, or some other visual identifier. The identifier 355 can identify a battery type of the battery 115 coupled with the tray 125. The identifier 355 can identify a particular iteration of the first member 130 (e.g., a particular first member 130 having a dimension or feature to suit a particular battery type), a particular iteration of the battery tray 125 (e.g., a particular first member 130 or second member 135 having particular a dimension or feature to suit a particular battery type), a material composition of the first member 130 or the second member 135, or some other parameter. The battery energy storage system 100 can include multiple batteries 115 coupled with multiple trays 125, where at least one of the trays 125 can be different than at least one of the other trays 125. For example, the identifier 355 can distinguish one tray 125 or associated battery 115 from another tray 125 or associated battery 115.

Figure 6:
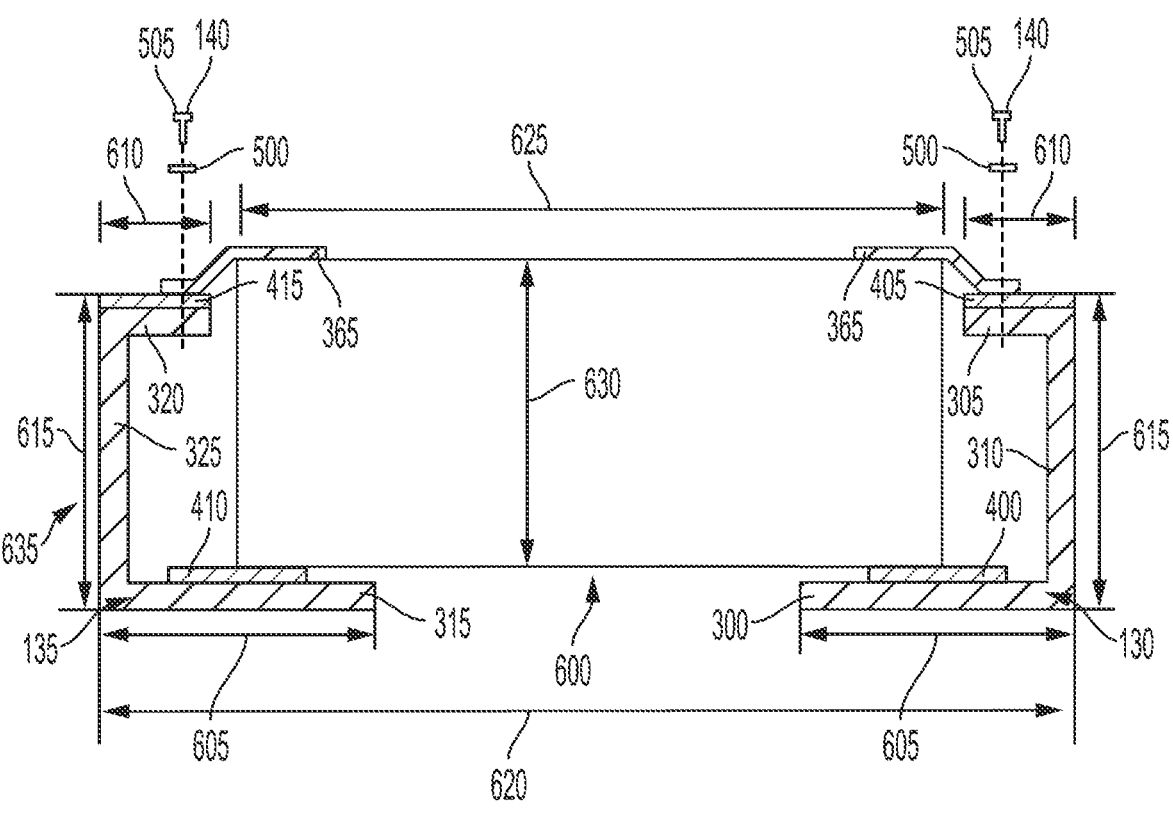
FIG. 6 depicts an example battery tray for a battery energy storage system, in accordance with some aspects.
Figure 7:
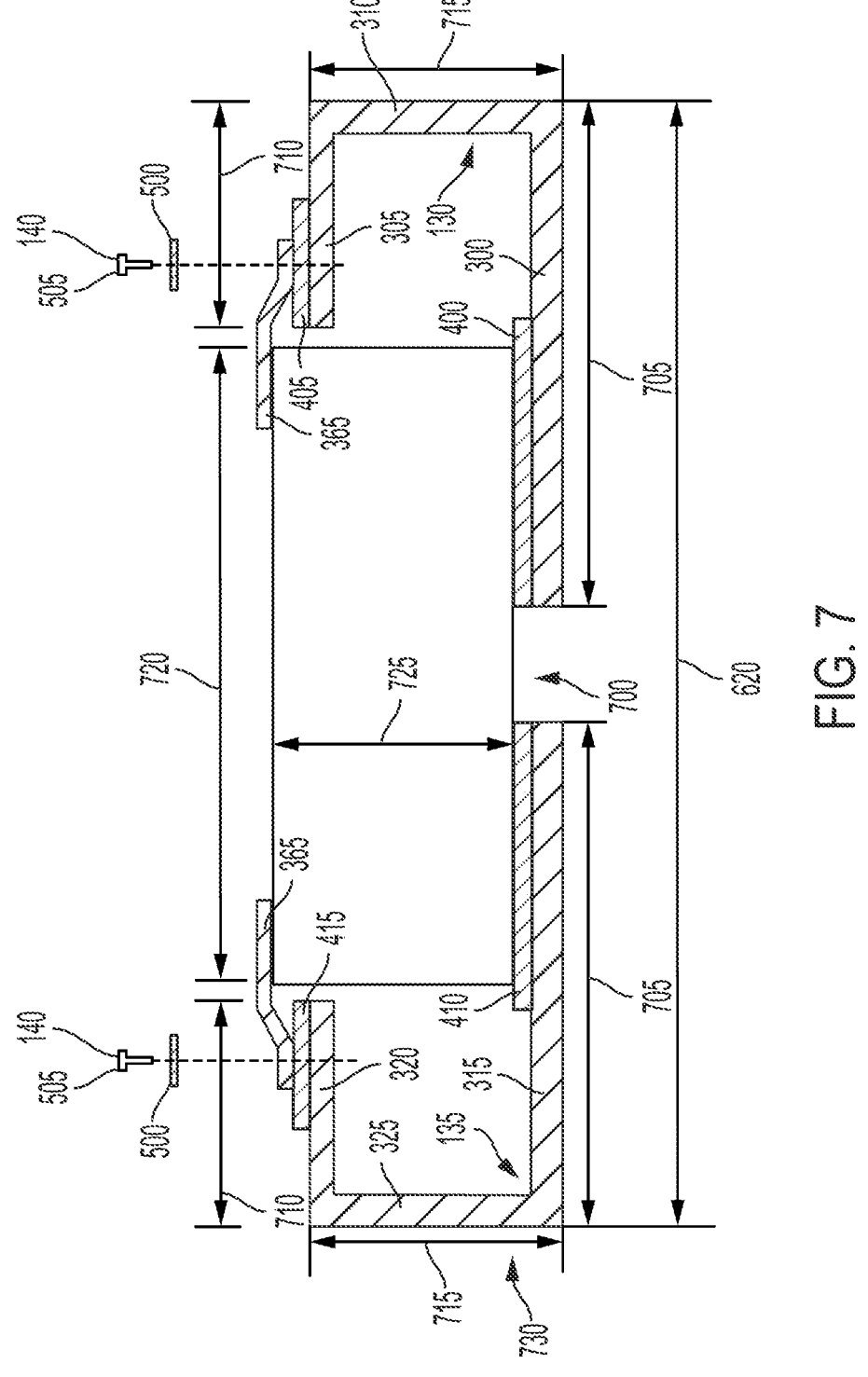
FIG. 7 depicts an example battery tray for a battery energy storage system, in accordance with some aspects.

The battery energy storage system 100 can include a first tray 125 to support a first battery 115 having a first battery type and a second tray to support a second battery 115 having a second battery type. For example, the battery energy storage system 100 can include multiple batteries 115. At least one battery 115 can be different from at least one other battery 115, as depicted in FIGS. 6 and 7. For example, a first battery 600 can be a battery module from a first electric vehicle. The first battery 600 can include a first width 625 and a first height 630. A second battery 700 can include a second width 720 and a second height 725. The first width 625 can be the same as or different than the second width 720. For example, the second width 720 of the second battery 700 can be smaller than (e.g., 50% as wide as) the first width 625 of the first battery 600. The first battery 600 can include at least one dimension that differs from a dimension of the second battery 700 or some other battery. For example, the first battery 600 can include the first width 625 that is different than the second width 720 of the second battery 700. The first battery 600 can include the first height 630 that is different than the second height 725 of the second battery 700. Additional dimensions or features of the first battery 600 of the first battery type can differ from the second battery 700 of the second battery type.

The battery energy storage system 100 can include a first tray 635 having first dimensions to accommodate the first battery 600 of a first battery type and a second tray 730 having second dimensions to accommodate the second battery 700 of a second battery type. For example, the first tray 635 can include dimensions to accommodate at least one battery 600 of the first battery type. The second tray 730 can include dimensions to accommodate at least one battery 700 of the second battery type. The battery energy storage system 100 can include additional trays 125 having dimension to accommodate batteries 115 of different battery types (e.g., a third battery type, a fourth battery type, or some other battery type). The first battery tray 635 can include at least one dimension that differs from at least one dimension of the second battery tray 730. For example, the first battery tray 635 can include first member 130 having a first lower portion 300 extending from the first side portion 310 at a first lower length 605. The first member 130 of the first battery tray 635 can include a first upper portion 305 extending from the first side portion 310 at a first upper length 610. The second member 135 of the first tray 635 can include the second lower portion 315 extending from the second side portion 325 at the first lower length 605 or some other length (e.g., such that the first lower portion 300 and the second lower portion 315 extend from respective side portions 310, 325 at different lengths).

The second member 135 of the first tray 635 can include the second upper portion 320 extending from the second side portion 325 at the first upper length 610 or some other length (e.g., such that the first upper portion 305 and the second upper portion 320 extend from respective side portions 310, 325 at different lengths). The first upper portion 305 or the second upper portion 320 can include a first plurality of apertures to couple the mounting flange 365 of the first battery 600 with the first tray 635. For example, the mounting flange 365 of the first battery 600 can include a first plurality of apertures (e.g., two, five, nine, eleven, or some other number). The first mounting flange 365 can be coupled with the first upper portion 305 or the second upper portion 320 via a first plurality of fasteners 140. Accordingly, the first plurality of apertures of the first upper portion 305 and the second upper portion 320 can correspond to a number of apertures formed in the mounting flange 365 of the battery 600 of the first battery type.

The first tray 635 can include a height 615. For example, the first member 130 of the first tray 635 can include height 615. The height 615 can be a distance between the first lower portion 300 and the first upper portion 305. The second member 135 of the first tray 635 can include a height 615 or some other height (e.g., such that the first member 130 is taller or shorter than the second member 135). The first tray 635 can include an overall width 620 that corresponds to a distance between rails 230 of the frame 120. For example, and as discussed above, the frame 120 can include pairs of rails 230 to support a tray 125. To support the tray 125, the surface 235 of the rail 230 can contact a first lower portion 300 and second lower portion 315 (or a roller 330 extending therefrom) of the tray 125. Accordingly, the tray 125 can have a width 620 such that the first lower portion 300, the second lower portion 315, or a roller 330 extending therefrom can contact the rail 230.

The first member 130 of the first tray 635 can have at least one dimension or feature that differs from the second member 135 of the first tray 635. For example, the first member 130 can include the first lower portion 300 extending from the first side portion 310 at the first lower distance 605, while the second lower portion 315 can extend from the second side portion 325 at a distance that is greater or less than the first lower distance 605 (e.g., twice the first lower distance 605, less than the first lower distance 605, more than twice the first lower distance 605, or some other distance). The first tray 635 can include first member 130 having other structural differences from the second member 135. For example, the second member 135 can include a second lower portion 315 having a curved surface or extending from the second side portion 325 at an angle, or some other feature. The first member 130 can differ from the second member 135 to accommodate the first battery 600 of the first battery type. For example, the first battery 600 of the first battery type can include a non-parallelepiped shape, a sloped or curved surface, a protrusion or jagged edge (e.g., an extension, bump-out, or projection extending from the first battery 600), or some other feature that requires a change to a dimension of the first member 130 or the second member 135.

The second battery tray 730 can include first member 130 having a first lower portion 300 extending from the first side portion 310 at a second lower length 705. The first member 130 of the second battery tray 730 can include a first upper portion 305 extending from the first side portion 310 at a second upper length 710. The second member 135 of the second tray 730 can include the second lower portion 315 extending from the second side portion 325 at the second lower length 705 or some other length (e.g., such that the first lower portion 300 and the second lower portion 315 extend from respective side portions 310, 325 at different lengths).

The second member 135 of the second tray 730 can include the second upper portion 320 extending from the second side portion 325 at the second upper length 710 or some other length (e.g., such that the first upper portion 305 and the second upper portion 320 extend from respective side portions 310, 325 at different lengths). The first upper portion 305 or the second upper portion 320 can include a second plurality of apertures to couple the mounting flange 365 of the second battery 700 with the second tray 730. For example, the mounting flange 365 of the second battery 700 can include a second plurality of apertures (e.g., two, five, nine, eleven, or some other number). The mounting flange 365 can be coupled with the first upper portion 305 or the second upper portion 320 via a second plurality of fasteners 140. Accordingly, the second plurality of apertures of the first upper portion 305 and the second upper portion 320 of the second tray 730 can correspond to a number of apertures formed in the mounting flange 365 of the second battery 700 of the second battery type.

The second tray 730 can include a height 715. For example, the first member 130 of the second tray 730 can include height 715. The height 715 can be a distance between the first lower portion 300 and the first upper portion 305. The second member 135 of the second tray 730 can include a height 715 or some other height (e.g., such that the first member 130 is taller or shorter than the second member 135). The second tray 730 can include an overall width 620. The width 620 can be the same as or substantially similar to (e.g., ±90% similar to) the width 620 of the first tray 635. For example, the second tray 730 can include the width 620 such that the second tray 730 can be supported by at least one rail 230 of the frame 120.

The first member 130 of the second tray 730 can have at least one dimension or feature that differs from the second member 135 of the second tray 730. For example, the first member 130 can include the first lower portion 300 extending from the first side portion 310 at the second lower length 705, while the second lower portion 315 can extend from the second side portion 325 at a distance that is greater or less than the second lower length 705 (e.g., twice the second lower length 705, less than the second lower length 705, more than twice the second lower length 705, or some other distance). The second tray 730 can include first member 130 having other structural differences from the second member 135. For example, the second member 135 can include a second lower portion 315 having a curved surface or extending from the second side portion 325 at an angle, or some other feature. The first member 130 can differ from the second member 135 to accommodate the second battery 700 of the second battery type. For example, the second battery 700 of the second battery type can include a non-parallelepiped shape, a sloped or curved surface, a protrusion or jagged edge (e.g., an extension, bump-out, or projection extending from the second battery 700), or some other feature that requires a change to a dimension of the first member 130 or the second member 135.

The second lower length 705 can be different than the first lower length 605. For example, the second battery 700 of the second battery type is smaller (e.g., has dimensions that are smaller) than the first battery 600 of the first battery type. To accommodate the smaller dimensions of the second battery 700, the second tray 730 can include then the first lower portion 300 of the second tray 730 having a second lower length 705 that exceeds the first lower length 605 of the first tray 635. For example, the second lower length 705 can be greater than the first lower length 605 such that the battery 700 of the second battery type can be supported by the first lower portion 300 and the second lower portion 315 of the second tray 730. The second tray 730 can include the height 715 that is smaller than the height 615 of the first tray 635. For example, the first battery 600 can have the height 630 that is greater than the height 725 of the second battery 700. To accommodate the battery 600 of the first type, the first tray 635 can include the height 615 that is greater than the height 715 of the second tray 730.

The battery energy storage system 100 can include the first battery tray 635 to accommodate a first battery 600 of a first battery type. The battery energy storage system 100 can include the second battery tray 730 including the second battery 700 of a second battery type. The first tray 635 can be different than the second tray 730 to accommodate a different between the first battery type and the second battery type. For example, the first battery tray 635 can include at least one dimension (e.g., a first lower length 605, a first upper length 610, or a first height 615) that differs from at least one dimension (e.g., a second lower length 705, a second upper length 710, or a second height 715) of the second tray 730. The first tray 635 can include a first plurality of apertures corresponding to a plurality of apertures or fasteners of the mounting flange 365 of the first battery 600 of the first battery type. The second tray 730 can include a second plurality of apertures corresponding to a plurality of apertures or fasteners of the mounting flange 365 of the second battery 700 of the second battery type. The first plurality of apertures can be greater than or less than the second plurality of apertures.

The battery energy storage system 100 can include the frame 120 to receive a first tray 635 having first dimensions to accommodate a first battery 600 of a first battery type. The battery energy storage system 100 can include the frame 120 to receive a second tray 730 having second dimensions to accommodate a second battery 700 of a second battery type. As discussed above, one or more dimensions of the first tray 635 can differ from one or more dimensions of the second tray 730. However, both the first tray 635 and the second tray 730 can include at least one dimension to facilitate an interaction between the first tray 635 and the rail 230 of the frame 120 and between the second tray 730 and a rail 230 of the frame 120. The first tray 635 can interact with a rail 230 of the frame 120. For example, the first battery tray 635 can include a width 620 to interact with at least one rail 230 of the frame 120 such that the rail 230 can support the first tray 635. The second tray 730 can interact with a rail 230 of the frame 120. For example, the second tray can include the width 620 to interact with at least one rail 230 of the frame 120 such that the rail 230 can support the second tray 730.

Figure 9:
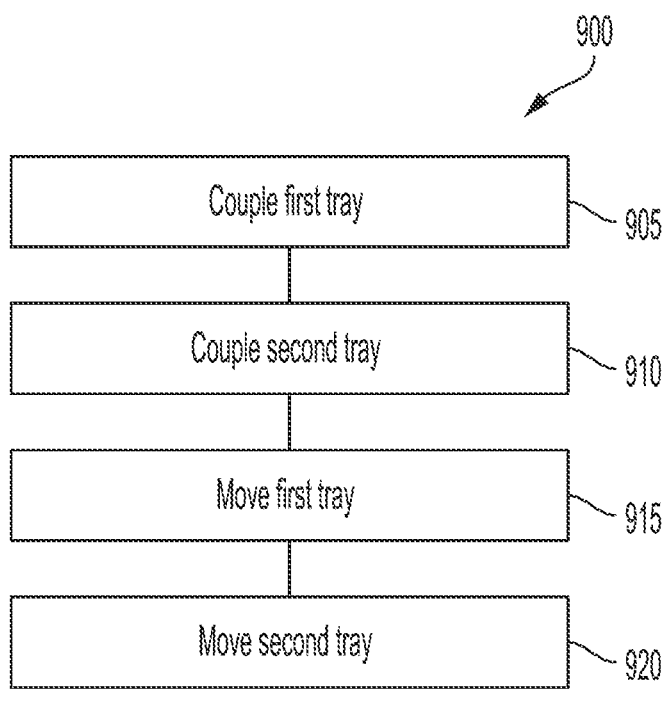
FIG. 9 is a flow chart of an example method, in accordance with some aspects.

FIG. 9, among others, depicts a method 900. The method 900 can be performed by an operator (e.g., field technician, a user, an individual, or some other person). The method 900 can include at least one of ACTS 905-920. The ACTS 905-920 can be performed in an order as depicted in FIG. 6 or in some other order.

The method 900 can include coupling the first tray at ACT 905. For example, the method 900 can include coupling a tray 125 to a battery 115 at ACT 905. The tray 125 can be the first tray 635. The battery 115 can be the first battery 600. The first battery 600 can be of a first battery type. For example, the first battery 600 can include a width 625, a height 630, and a mounting flange 365 with a first plurality of apertures. The first tray 635 can include a first member 130 and a second member 135. The first member 130 can include a first lower portion 300 that extends a first lower length 605 from a first side portion 310. The first member 130 can include a first upper portion 305 that extends a first upper length 610 from the first side portion 310. The first member 130 can include a first height 615. The second member 135 of the first tray 635 can include a second lower portion 315 that extends a length (e.g., the first lower length 605 or some other length) from a second side portion 325. The second member 135 can include a second upper portion 320 that extends a length (e.g., the first upper length 610 or some other length) from the second side portion 325. The first tray 635 can span a width 620 with the first member 130 and the second member 135 coupled with or supporting the first battery 600 of the first battery type.

The method 900 can include coupling the second tray at ACT 910. For example, the method 900 can include coupling a tray 125 to a battery 115 at ACT 910. The tray 125 can be the second tray 730. The battery 115 can be the second battery 700. The second battery 700 can be of a second battery type. For example, the second battery 700 can include a width 720, a height 725, and a mounting flange 365 with a second plurality of apertures. The second tray 730 can include a first member 130 and a second member 135. The first member 130 can include a first lower portion 300 that extends a second lower length 705 from a first side portion 310. The first member 130 can include a first upper portion 305 that extends a second upper length 710 from the first side portion 310. The first member 130 can include a second height 715. The second member 135 of the first tray 635 can include a second lower portion 315 that extends a length (e.g., the second lower length 705 or some other length) from a second side portion 325. The second member 135 can include a second upper portion 320 that extends a length (e.g., the second upper length 710 or some other length) from the second side portion 325. The second tray 730 can span a width 620 with the first member 130 and the second member 135 coupled with or supporting the second battery 700 of the second battery type.

The method 900 can including moving a tray at ACT 915. For example, the method 900 can include moving the first battery tray 635 from the maintenance position 800 to a stored position with the first tray 635 coupled with or supporting the first battery 600. The first tray 635 can interact with at least one rail 230 of the frame 120 of the battery energy storage system 100. For example, the first tray 635 can include a width 620 such that at least one of the first member 130, the second member 135, or at least one roller 330 coupled with the first member 130 or the second member 135 can interact (e.g. contact, be supported by, roll along) the surface 235 of the at least one rail 230. The first tray 635 can be slidably supported by the rail 230 such that the first tray 635 and the first battery 600 can slide into the cavity 160 of the enclosure 105 (e.g., to a stored position) or out of the cavity 160 (e.g., to a maintenance position 800) with the first tray 635 supported by the frame 120.

The method 900 can including moving a tray at ACT 920. For example, the method 900 can include moving the second battery tray 730 from the maintenance position 800 to a stored position with the second tray 730 coupled with or supporting the second battery 700. The second tray 730 can interact with at least one rail 230 of the frame 120 of the battery energy storage system 100. For example, the second tray 730 can include a width 620 such that at least one of the first member 130, the second member 135, or at least one roller 330 coupled with the first member 130 or the second member 135 can interact (e.g. contact, be supported by, roll along) the surface 235 of the at least one rail 230. The second tray 730 can be slidably supported by the rail 230 such that the second tray 730 and the first battery 600 can slide into the cavity 160 of the enclosure 105 (e.g., to a stored position) or out of the cavity 160 (e.g., to a maintenance position 800) with the first tray 635 supported by the frame 120.

Figure 10:
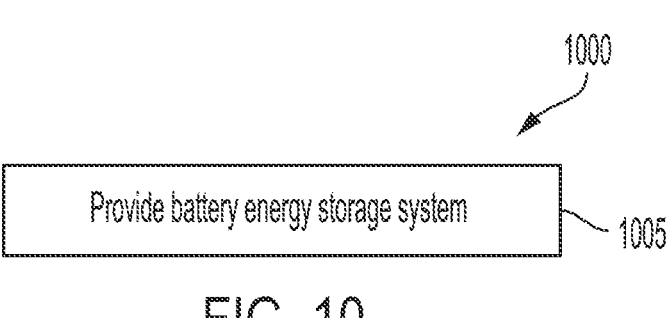
FIG. 10 is a flow chart of an example method, in accordance with some aspects.

FIG. 10, among others, depicts a method 1000 of providing a battery energy storage system 100 at ACT 1005. The battery energy storage system 100 can include at least one battery 115 coupled with or supported by at least one battery tray 125. For example, the battery energy storage system 100 can include a first tray 635 coupled with or supporting a first battery 600 of a first battery type. The first battery tray 635 can include a first member 130 and a second member 135. The first member 130 can include a first lower portion 300 extending a first lower length 605 from a first side portion 310, and a first upper portion 305 extending a first upper length 610 from the first side portion 310. The second member 135 can include a second lower portion 315 extending a length (e.g., the first lower length 605 or some other length) from a second side portion 325, and a second upper portion 320 extending a length (e.g., the first upper length 610 or some other length) from the second side portion 325. The first tray 635 can include a first height 615. The first upper portion 305 or the second upper portion 320 can define a first plurality of apertures. The first tray 635 can span a first width 620 with the first member 130 and the second member 135 coupled with the first battery 600.

The battery energy storage system 100 can include a second tray 730 coupled with or supporting a second battery 700 of a second battery type. The second battery tray 730 can include a first member 130 and a second member 135. The first member 130 can include a first lower portion 300 extending a second lower length 705 from a first side portion 310, and a first upper portion 305 extending a second upper length 710 from the first side portion 310. The second lower length 705 and the second upper length 710 can differ from the first lower length 605 and the first upper length 610, respectively, in order to accommodate a difference between the first battery type and the second battery type. The second member 135 can include a second lower portion 315 extending a length (e.g., the second lower length 705 or some other length) from a second side portion 325, and a second upper portion 320 extending a length (e.g., the second upper length 710 or some other length) from the second side portion 325. The second tray 730 can include a second height 715 that is different than or the same as the first height 615. The first upper portion 305 or the second upper portion 320 can define a second plurality of apertures that is different than or the same as the first plurality of apertures. The second tray 730 can span a second width 720 with the first member 130 and the second member 135 coupled with the second battery 700.

Figure 11:
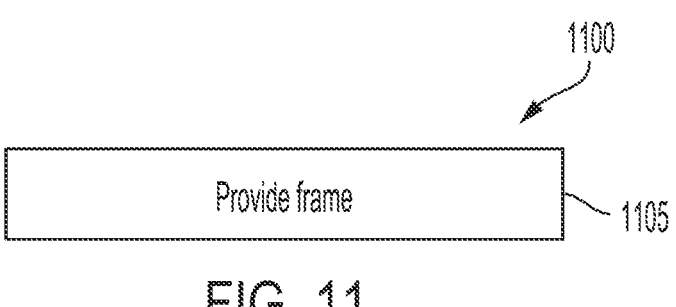
FIG. 11 is a flow chart of an example method, in accordance with some aspects.

FIG. 11, among others, depicts a method 1100 of providing a frame at ACT 1105. For example, the method 1100 can include providing a frame 120 of a battery energy storage system 100 to support a first battery tray 635 and a second battery tray 730. The first battery tray 635 and the second battery tray 730 can interact with (e.g., contact, be supported by, roll against, translate with respect to) at least one rail 230 of the frame 120. The first battery tray 635 can include a first member 130 and a second member 135. The first member 130 can include a first lower portion 300 extending a first lower length 605 from a first side portion 310, and a first upper portion 305 extending a first upper length 610 from the first side portion 310. The second member 135 can include a second lower portion 315 extending a length (e.g., the first lower length 605 or some other length) from a second side portion 325, and a second upper portion 320 extending a length (e.g., the first upper length 610 or some other length) from the second side portion 325. The first tray 635 can include a first height 615. The first upper portion 305 or the second upper portion 320 can define a first plurality of apertures. The first tray 635 can span a first width 620 with the first member 130 and the second member 135 coupled with the first battery 600.

The frame 120 of the battery energy storage system 100 can support a second tray 730 coupled with or supporting a second battery 700 of a second battery type. The second battery tray 730 can include a first member 130 and a second member 135. The first member 130 can include a first lower portion 300 extending a second lower length 705 from a first side portion 310, and a first upper portion 305 extending a second upper length 710 from the first side portion 310. The second lower length 705 and the second upper length 710 can differ from the first lower length 605 and the first upper length 610, respectively, in order to accommodate a difference between the first battery type and the second battery type. The second member 135 can include a second lower portion 315 extending a length (e.g., the second lower length 705 or some other length) from a second side portion 325, and a second upper portion 320 extending a length (e.g., the second upper length 710 or some other length) from the second side portion 325. The second tray 730 can include a second height 715 that is different than or the same as the first height 615. The first upper portion 305 or the second upper portion 320 can define a second plurality of apertures that is different than or the same as the first plurality of apertures. The second tray 730 can span a second width 720 with the first member 130 and the second member 135 coupled with the second battery 700.

Some of the description herein emphasizes the structural independence of the aspects of the system components or groupings of operations and responsibilities of these system components. Other groupings that execute similar overall operations are within the scope of the present application. Modules can be implemented in hardware or as computer instructions on a non-transient computer readable storage medium, and modules can be distributed across various hardware or computer based components.

The systems described above can provide multiple ones of any or each of those components and these components can be provided on either a standalone system or on multiple instantiation in a distributed system. In addition, the systems and methods described above can be provided as one or more computer-readable programs or executable instructions embodied on or in one or more articles of manufacture. The article of manufacture can be cloud storage, a hard disk, a CD-ROM, a flash memory card, a PROM, a RAM, a ROM, or a magnetic tape. In general, the computer-readable programs can be implemented in any programming language, such as LISP, PERL, C, C++, C#, PROLOG, or in any byte code language such as JAVA. The software programs or executable instructions can be stored on or in one or more articles of manufacture as object code.

Example and non-limiting module implementation elements include sensors providing any value determined herein, sensors providing any value that is a precursor to a value determined herein, datalink or network hardware including communication chips, oscillating crystals, communication links, cables, twisted pair wiring, coaxial wiring, shielded wiring, transmitters, receivers, or transceivers, logic circuits, hard-wired logic circuits, reconfigurable logic circuits in a particular non-transient state configured according to the module specification, any actuator including at least an electrical, hydraulic, or pneumatic actuator, a solenoid, an op-amp, analog control elements (springs, filters, integrators, adders, dividers, gain elements), or digital control elements.

The subject matter and the operations described in this specification can be implemented in digital electronic circuitry, or in computer software, firmware, or hardware, including the structures disclosed in this specification and their structural equivalents, or in combinations of one or more of them. The subject matter described in this specification can be implemented as one or more computer programs, e.g., one or more circuits of computer program instructions, encoded on one or more computer storage media for execution by, or to control the operation of, data processing apparatuses. Alternatively or in addition, the program instructions can be encoded on an artificially generated propagated signal, e.g., a machine-generated electrical, optical, or electromagnetic signal that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. While a computer storage medium is not a propagated signal, a computer storage medium can be a source or destination of computer program instructions encoded in an artificially generated propagated signal. The computer storage medium can also be, or be included in, one or more separate components or media (e.g., multiple CDs, disks, or other storage devices include cloud storage). The operations described in this specification can be implemented as operations performed by a data processing apparatus on data stored on one or more computer-readable storage devices or received from other sources.

The terms "computing device", "component" or "data processing apparatus" or the like encompass various apparatuses, devices, and machines for processing data, including by way of example a programmable processor, a computer, a system on a chip, or multiple ones, or combinations of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, app, script, or code) can be written in any form of programming language, including compiled or interpreted languages, declarative or procedural languages, and can be deployed in any form, including as a stand-alone program or as a module, component, subroutine, object, or other unit suitable for use in a computing environment. A computer program can correspond to a file in a file system. A computer program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatuses can also be implemented as, special purpose logic circuitry, e.g., an FPGA (field programmable gate array) or an ASIC (application specific integrated circuit). Devices suitable for storing computer program instructions and data can include non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

The subject matter described herein can be implemented in a computing system that includes a back end component, e.g., as a data server, or that includes a middleware component, e.g., an application server, or that includes a front end component, e.g., a client computer having a graphical user interface or a web browser through which a user can interact with an implementation of the subject matter described in this specification, or a combination of one or more such back end, middleware, or front end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While operations are depicted in the drawings in a particular order, such operations are not required to be performed in the particular order shown or in sequential order, and all illustrated operations are not required to be performed. Actions described herein can be performed in a different order.

Having now described some illustrative implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation or embodiment, and references to "an implementation," "some implementations," "one implementation" or the like are not necessarily mutually exclusive and are intended to indicate that a particular feature, structure, or characteristic described in connection with the implementation may be included in at least one implementation or embodiment. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms. References to at least one of a conjunctive list of terms may be construed as an inclusive OR to indicate any of a single, more than one, and all of the described terms. For example, a reference to "at least one of 'A' and 'B'" can include only 'A', only 'B', as well as both 'A' and 'B'. Such references used in conjunction with "comprising" or other open terminology can include additional items.

Where technical features in the drawings, detailed description or any claim are followed by reference signs, the reference signs have been included to increase the intelligibility of the drawings, detailed description, and claims. Accordingly, neither the reference signs nor their absence have any limiting effect on the scope of any claim elements.

Modifications of described elements and acts such as variations in sizes, dimensions, structures, shapes and proportions of the various elements, values of parameters, mounting arrangements, use of materials, colors, orientations can occur without materially departing from the teachings and advantages of the subject matter disclosed herein. For example, elements shown as integrally formed can be constructed of multiple parts or elements, the position of elements can be reversed or otherwise varied, and the nature or number of discrete elements or positions can be altered or varied. Other substitutions, modifications, changes and omissions can also be made in the design, operating conditions and arrangement of the disclosed elements and operations without departing from the scope of the present disclosure.

For example, descriptions of positive and negative electrical characteristics may be reversed. Elements described as negative elements can instead be configured as positive elements and elements described as positive elements can instead by configured as negative elements. For example, elements described as having first polarity can instead have a second polarity, and elements described as having a second polarity can instead have a first polarity. Further relative parallel, perpendicular, vertical or other positioning or orientation descriptions include variations within +/−10% or +/−10 degrees of pure vertical, parallel or perpendicular positioning. References to "approximately," "substantially" or other terms of degree include variations of +/−10% from the given measurement, unit, or range unless explicitly indicated otherwise. Coupled elements can be electrically, mechanically, or physically coupled with one another directly or with intervening elements. Scope of the systems and methods described herein is thus indicated by the appended claims, rather than the foregoing description, and changes that come within the meaning and range of equivalency of the claims are embraced therein.

What is claimed is:

1. A battery energy storage system, comprising:
an enclosure including a panel to provide access to a cavity defined by the enclosure;
a frame positioned within the cavity, the frame comprising:
a first rail to accommodate a first battery tray coupled with a first battery of a first battery type, the first battery tray including a first lower portion extending inward by a first distance, the first distance being fixed; and
a second rail to accommodate a second battery tray coupled with a second battery of a second battery type, the second battery tray including a second lower portion extending inward by a second distance, the second distance being fixed and being different than the first distance;
wherein a dimension of the first battery type is different than a dimension of the second battery type.

2. The battery energy storage system of claim 1, comprising:
the first lower portion of the first battery tray to support the first battery, the first lower portion of the first battery tray extending the first distance from a side portion of the first battery tray; and
the second lower portion of the second battery tray to support the second battery, the second lower portion of the second battery tray extending a second distance from a second portion of the second battery tray;
wherein the first distance is different than the second distance to accommodate a difference between the dimension of the first battery type and the dimension of the second battery type.

3. The battery energy storage system of claim 1, comprising:
an upper portion of the first battery tray to receive a first plurality of fasteners to couple with the first battery; and
an upper portion of the second battery tray to receive a second plurality of fasteners to couple with the second battery;
wherein the first plurality of fasteners is different than the second plurality of fasteners.

4. The battery energy storage system of claim 1, comprising:
an upper portion of the first battery tray, the upper portion of the first battery tray to receive a first plurality of fasteners to couple with the first battery, the first lower portion of the first battery tray extending the first distance from a side portion of the first battery tray to support the first battery; and
an upper portion of the second battery tray, the upper portion of the second battery tray to receive a second plurality of fasteners to couple with the second battery, the second lower portion of the second battery tray extending the second distance from a side portion of the second battery tray to support the second battery;
wherein the first distance that is different than the second distance to accommodate a difference between the dimension of the first battery type and the dimension of the second battery type.

5. The battery energy storage system of claim 1, comprising:

the first battery tray including a first roller, the second battery tray including a second roller, the first roller to interact with the first rail to facilitate a movement of the first battery tray into and out of the frame, the second roller to interact with the second rail to facilitate a movement of the second battery tray into and out of the frame.

6. The battery energy storage system of claim 1, comprising:

the first battery tray including a first roller, the second battery tray including a second roller, the first roller to interact with the first rail to facilitate a movement of the first battery tray between a first installed position and a first maintenance position, the second roller to interact with the second rail to facilitate a movement of the second battery tray between a second installed position and a second maintenance position;

wherein the first battery tray and the second battery tray can be in the respective first and second maintenance positions with the panel in an open position.

7. The battery energy storage system of claim 1, comprising:

the frame defining a channel extending between the first battery tray, the second battery tray, and an auxiliary tray, the channel to receive a first connector coupled with the first battery and a second connector associated with the second battery;

wherein the auxiliary tray includes at least one of a control device and a cooling device.

8. The battery energy storage system of claim 1, comprising:

a cooling device supported by an auxiliary tray, the cooling device coupled with a conduit, the conduit coupled with at least one of the first battery or the second battery to provide coolant to the first battery or the second battery.

9. The battery energy storage system of claim 1, comprising:

a cooling device supported by an auxiliary tray, the cooling device including a first conduit, and a second conduit, the first conduit coupled with the first battery to provide coolant to the first battery, the second conduit coupled with the second battery to provide coolant to the second battery; and the frame defining a passage, wherein the first conduit and the second conduit respectively extend from the cooling device to the first battery and the second battery via the passage.

10. The battery energy storage system of claim 1, comprising:

a cooling device supported by an auxiliary tray, the cooling device including a first conduit, and a second conduit, the first conduit coupled with a first port of the first battery to provide coolant to the first battery, the second conduit coupled with a second port of the second battery to provide coolant to the second battery;

the frame defining a passage, wherein the first conduit and the second conduit respectively extend from the cooling device to the first battery and the second battery via the passage;

the first battery tray including a first roller, the second battery tray including a second roller, the first roller to interact with the first rail to facilitate a movement of the first battery tray between a first installed position and a first maintenance position, the second roller to interact with the second rail to facilitate a movement of the second battery tray between a second installed position and a second maintenance position;

wherein the first port and the second port are accessible with the first battery tray in the first maintenance position and the second battery tray in the second maintenance position.

11. The battery energy storage system of claim 1, comprising:

the first battery tray including a first identifier to identify the first battery type; and the second battery tray including a second identifier to identify the second battery type.

12. The battery energy storage system of claim 1, comprising:

the first battery tray and the second battery tray including a first member coupled with a respective first side of the first battery or the second battery and a second member coupled with a respective second side of the first battery or the second battery;

wherein a dimension of the first member or the second member of the first battery tray differs from a dimension of the first member or the second member of the second battery tray.

13. A frame of a battery energy storage system, comprising:

a first pair of rails coupled with the frame and separated by a distance, the first pair of rails to support a first battery tray, the first battery tray to accommodate a first battery type, the first battery tray including a first lower portion extending inward by a first distance, the first distance being fixed;

a second pair of rails coupled with the frame and separated by the distance, the second pair of rails to support a second battery tray, the second battery tray to accommodate a second battery type, the second battery tray including a second lower portion extending inward by a second distance, the second distance being fixed and being different than the first distance;

wherein a first battery of the first battery type includes a dimension that differs from a dimension of a second battery of the second battery type.

14. The frame of claim 13, comprising:

a third pair of rails coupled with the frame and separated by the distance, the third pair of rails to support a cooling tray, the cooling tray including a cooling device to circulate coolant; and a passage extending between the first battery tray, the second battery tray, and the cooling tray, the passage to receive a first connector to couple the first battery with the cooling device, and a second connector to couple the second battery with the cooling device.

15. The frame of claim 13, comprising:

the first battery tray including a first roller, the second battery tray including a second roller, the first roller to facilitate a movement of the first battery tray along the first pair of rails between a first installed position and a first maintenance position, the second roller to facilitate a movement of the second battery tray along the second pair of rails between a second installed position and a second maintenance position;

wherein the at least one of a coolant port or an electrical connector of the first battery and the second battery are accessible with the first battery in the first maintenance position and the second battery in the second maintenance position.

16. The frame of claim 13, comprising:

the first battery tray including a first side member coupled with the first lower portion to support the first battery; and the second battery tray including a second side member coupled with the second lower portion to support the second battery;

wherein the first distance of the first lower portion that is different than the second distance of the second lower portion to accommodate a difference between the dimension of the first battery type and the dimension of the second battery type.

17. The frame of claim 13, comprising:

the first battery tray including a first side member and a first top portion, the first top portion to receive a first plurality of fasteners to couple with the first battery, the first lower portion extending the first distance from the first side member to support the first battery; and the second battery tray including a second side member and a second top portion, the second top portion to receive a second plurality of fasteners to couple with the second battery, the second lower portion extending the second distance from the second side member to support the second battery;

wherein the first distance that is different than the second distance to accommodate a difference between the dimension of the first battery type and the dimension of the second battery type.

18. A method, comprising:

coupling a first battery tray with a first battery of a first battery type, the first battery tray including a first lower portion extending inward by a first distance, the first distance being fixed;

coupling a second battery tray with a second battery of a second battery type, the second battery tray including a second lower portion extending inward by a second distance, the second distance being fixed and different than the first distance;

moving the first battery tray and the first battery along a first pair of rails of a battery energy storage system frame, the first pair of rails separated by a rail distance; and moving the second battery tray and the second battery along a second pair of rails of the battery energy storage system frame, the second pair of rails separated by the rail distance;

wherein a dimension of first battery of the first battery type differs from a dimension of the second battery of the second battery type.

19. The method of claim 18, comprising:

the first battery tray including a first member having the first lower portion to support the first battery, the first lower portion extending the first distance from a first side portion; and the second battery tray including a second member having the second lower portion to support the second battery, the second lower portion extending the second distance from a second side portion;

wherein the first distance is different than the second distance to accommodate a difference between the dimension of the first battery type and the dimension of the second battery type.

20. The method of claim 18, wherein coupling the first battery tray with the first battery of the first battery type includes coupling a mounting flange of the first battery to a top portion of the first battery tray via a first plurality of fasteners;

wherein coupling the second battery tray with the second battery of the second battery type includes coupling a second mounting flange of the second battery to a first upper portion and a second upper portion of the second battery tray via a second plurality of fasteners;

wherein the first plurality of fasteners is different than the second plurality of fasteners.

\* \* \* \* \*